(12) United States Patent
Kawamura et al.

(10) Patent No.: US 11,754,493 B2
(45) Date of Patent: Sep. 12, 2023

(54) BROADBAND LIGHT SOURCE DEVICE AND BIOCHEMICAL ANALYZING DEVICE

(71) Applicant: Hitachi High-Tech Corporation, Tokyo (JP)

(72) Inventors: Tomoto Kawamura, Tokyo (JP); Takahiro Ando, Tokyo (JP); Shin Imamura, Tokyo (JP); Masaaki Komatsu, Tokyo (JP); Yuya Matsuoka, Tokyo (JP); Takeshi Ishida, Tokyo (JP); Sakuichiro Adachi, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 177 days.

(21) Appl. No.: 17/289,358

(22) PCT Filed: Oct. 9, 2019

(86) PCT No.: PCT/JP2019/039753
§ 371 (c)(1),
(2) Date: Apr. 28, 2021

(87) PCT Pub. No.: WO2020/100473
PCT Pub. Date: May 22, 2020

(65) Prior Publication Data
US 2021/0381954 A1    Dec. 9, 2021

(30) Foreign Application Priority Data

Nov. 15, 2018    (JP) .................................. 2018-214799

(51) Int. Cl.
*G01N 21/25*    (2006.01)
*G01N 21/31*    (2006.01)
(Continued)

(52) U.S. Cl.
CPC ......... *G01N 21/255* (2013.01); *G01N 21/314* (2013.01); *G01N 21/6428* (2013.01);
(Continued)

(58) Field of Classification Search
CPC ......... G01N 2021/3181; G01N 21/255; G01N 21/314; G01N 21/6428; G01N 2201/062; H01L 25/0753; H01L 33/502
See application file for complete search history.

(56) References Cited

U.S. PATENT DOCUMENTS 6,493,148 B1 * 12/2002 Anikitchev .......... G02B 27/143
359/618
2009/0201577 A1 * 8/2009 LaPlante ............ G01N 21/6458
313/501
(Continued)

FOREIGN PATENT DOCUMENTS

CN    102863962 A  *  1/2013
JP    S49062391 A    6/1974
(Continued)

OTHER PUBLICATIONS

Lee et al. "Synthesis and Catalytic Properties of Barium Hexaaluminates Incorporated With Chromium and Lanthanum" Reaction Kinetics and Catalysis Letters, 2005, pp. 299-306, vol. 86, No. 2.
(Continued)

*Primary Examiner* — Dominic J Bologna
(74) *Attorney, Agent, or Firm* — MILES & STOCKBRIDGE, P.C.

(57) ABSTRACT

A broadband light source device in a biochemical analyzing device, and facilitates maintenance thereof, including an LED substrate that is provided with an LED chip generating a light beam having a first wavelength band and including a fluorescent substance in the light beam having a first wavelength band and that is provided with an LED chip gener-
(Continued)

ating a light beam having a second wavelength band, in which the fluorescent substance includes at least alumina and at least one of Fe, Cr, Bi, Tl, Ce, Tb, Eu, and Mn and is produced by calcining a raw material that contains sodium at 6.1 to 15.9 wt. % in the whole raw material. The broadband light source device further includes an optical system including a light pipe that color-mixes the light beam passing through the fluorescent substance of the LED chip and the light beam emitted from the LED chip, and a flat dichroic prism.

10 Claims, 18 Drawing Sheets

(51) Int. Cl.
  *G01N 21/64* (2006.01)
  *H01L 25/075* (2006.01)
  *H01L 33/50* (2010.01)
(52) U.S. Cl.
  CPC .. *H01L 25/0753* (2013.01); *G01N 2021/3181* (2013.01); *G01N 2201/062* (2013.01); *H01L 33/502* (2013.01)

(56) References Cited

U.S. PATENT DOCUMENTS

| | | | |
|---|---|---|---|
| 2011/0101848 A1* | 5/2011 | Cormier | G01N 21/278 252/301.36 |
| 2012/0286205 A1 | 11/2012 | Zhou et al. | |
| 2017/0112370 A1 | 4/2017 | Daidoji et al. | |
| 2017/0229512 A1* | 8/2017 | Akagawa | H01L 33/507 |
| 2018/0180885 A1 | 6/2018 | Holland et al. | |
| 2019/0316963 A1 | 10/2019 | Ishida et al. | |

FOREIGN PATENT DOCUMENTS

| | | |
|---|---|---|
| JP | H05093187 A | 4/1993 |
| JP | 2001352101 A | 12/2001 |
| JP | 2003105334 A | 4/2003 |
| JP | 2003268366 A | 9/2003 |
| JP | 5047735 B2 | 10/2012 |
| JP | 2013519738 A | 5/2013 |
| JP | 2015060921 A | 3/2015 |
| JP | 2015060921 A * | 3/2015 |
| JP | 2015087185 A * | 5/2015 |
| JP | 2016040528 A | 3/2016 |
| JP | 2016040528 A * | 3/2016 |
| JP | 2016103556 A | 6/2016 |
| JP | 2017143253 A | 8/2017 |
| JP | 2017152566 A | 8/2017 |
| JP | 2017207354 A * | 11/2017 |
| JP | 2018105739 A | 7/2018 |
| KR | 1020120139650 A | 12/2012 |
| WO | 2016006371 A1 | 1/2016 |
| WO | WO-2016150807 A1 * | 9/2016 ............. H01L 33/58 |
| WO | 2019216083 A1 | 11/2019 |

OTHER PUBLICATIONS

Sohn et al. "Photoluminescence Behavior of BaAl12O19:Mn Phosphor Prepared by Pseudocombinatorial Chemistry Method" Journal of the Electrochemical Society, 2000, pp. 4368-4373, vol. 147, No. 11.
Ravichandran et al. "Crystal chemistry and luminescence of the Eu2+-activated alkaline earth aluminate phosphors" Displays, 1999, pp. 197-203, vol. 19.
Neto et al. "Iron luminescence thermal effects in sodium ß-alumina", Journal of Solid State Chemistry, 1986, pp. 199-204, 65.
Mariotto et al. "A comparative analysis of the luminescence of the Cr3+ ion in sodium ß- and ß"-alumina crystals" Solid State Ionics, 1990, pp. 328-330, 40/41.
Search Report dated Dec. 24, 2019 in corresponding International Application No. PCT/JP2019/039753.
Written Opinion dated Dec. 24, 2019 in corresponding International Application No. PCT/JP2019/039753.
International Preliminary Report on Patentability dated Dec. 24, 2019 in corresponding International Application No. PCT/JP2019/039753.
Search Report dated Jun. 9, 2022 in European Application No. 19883355.0.
Hattori et al. "Luminescence from Cr3+ ions in mixed-cation ß-alumina crystals", Solid State Ionics, North Holland Pub. Company., vol. 70-71, May 1994, pp. 471-475.

* cited by examiner

[FIG. 1]
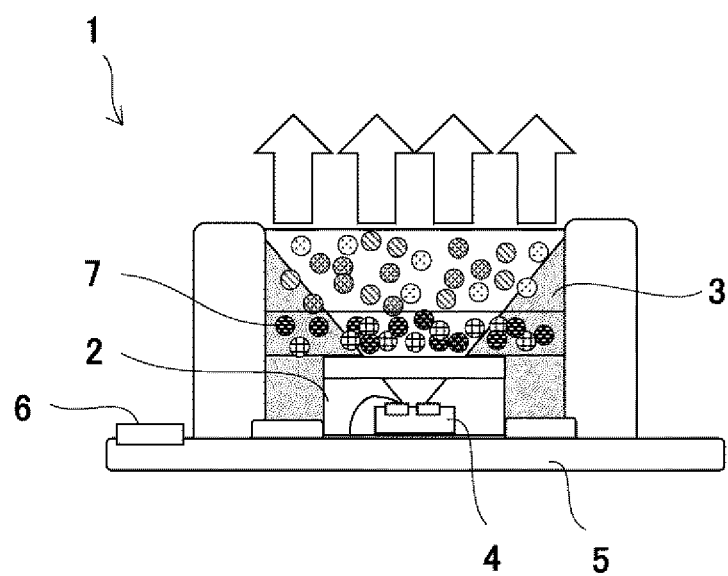

[FIG. 2]

| ITEM | COMPOSITION | RAW MATERIAL COMPOSITION | | | | |
|---|---|---|---|---|---|---|
| | | BaCO3 (g) | Na2CO3 (g) | Al2O3 (g) | FeCl2·4H2O (mg) | FLUX (mg) |
| COMPARATIVE EXAMPLE 1 | BaAl12O19:Fe ( α-ALUMINA ) | 1.22 | — | 3.77 | 10 | 5 |
| COMPARATIVE EXAMPLE 2 | BaAl12O19:Fe ( CALCINED ALUMINA ) | 1.22 | — | 3.65 | 120 | 5 |
| COMPARATIVE EXAMPLE 3 | BaAl12O19:Fe ( CALCINED ALUMINA ) | 0.47 | — | 1.45 | 47 | 27 |
| COMPARATIVE EXAMPLE 4 | BaAl12O19:Fe ( CALCINED ALUMINA ) | 0.43 | — | 1.49 | 24 | 55 |
| COMPARATIVE EXAMPLE 5 | BaAl12O19:Fe ( CALCINED ALUMINA ) | 0.38 | — | 1.48 | 24 | 110 |
| COMPARATIVE EXAMPLE 6 | BaAl12O19:Fe ( CALCINED ALUMINA ) | 0.39 | — | 1.49 | 8 | 110 |
| COMPARATIVE EXAMPLE 7 | BaAl12O19:Fe ( CALCINED ALUMINA ) | 0.48 | — | 1.49 | 10 | 25 |
| COMPARATIVE EXAMPLE 8 | BaAl12O19:Fe ( CALCINED ALUMINA ) | 0.39 | — | 1.50 | 4.9 | 111 |
| COMPARATIVE EXAMPLE 9 | BaAl12O19:Fe ( CALCINED ALUMINA ) | 0.39 | — | 1.50 | 2.5 | 111 |
| COMPARATIVE EXAMPLE 10 | Na-nAl2O3:Fe (FUSED ALUMINA) | | 0.42 | 0.92 | 36 | 190 |
| COMPARATIVE EXAMPLE 11 | Na-nAl2O3:Fe (FUSED ALUMINA) | | 2.17 | 2.32 | 41 | 470 |
| COMPARATIVE EXAMPLE 12 | Na-nAl2O3:Fe ( β-ALUMINA ) | — | 1.08 | 1.15 | 9 | 260 |
| EXAMPLE 1 | BaAl12O19:Fe ( β-ALUMINA ) | 0.38 | — | 1.48 | 30 | 110 |
| EXAMPLE 2 | BaAl12O19:Fe ( β-ALUMINA ) | 0.38 | — | 1.48 | 47 | 110 |
| EXAMPLE 3 | BaAl12O19:Fe ( β-ALUMINA ) | 0.43 | — | 1.45 | 47 | 55 |
| EXAMPLE 4 | BaAl12O19:Fe ( β-ALUMINA ) | 0.43 | — | 1.49 | 8 | 55 |
| EXAMPLE 5 | BaAl12O19:Fe ( β-ALUMINA ) | 0.43 | — | 1.48 | 24 | 55 |
| EXAMPLE 6 | Na-nAl2O3:Fe ( β-ALUMINA ) | — | 0.42 | 1.11 | 8 | 55 |
| EXAMPLE 7 | Na-nAl2O3:Fe ( β-ALUMINA ) | — | — | 1.11 | 8 | 55 |
| EXAMPLE 8 | Na-nAl2O3:Fe ( β-ALUMINA ) | — | 0.27 | 1.15 | 9 | 260 |
| EXAMPLE 9 | Na-nAl2O3:Fe ( β-ALUMINA ) | — | 0.27 | 1.15 | 23 | 260 |
| EXAMPLE 10 | Na-nAl2O3:Fe ( β-ALUMINA ) | — | 0.27 | 1.15 | 23 | — |
| EXAMPLE 11 | Na-nAl2O3:Fe ( β-ALUMINA ) | — | 0.27 | 1.15 | 23 | 260 |
| EXAMPLE 12 | Na-nAl2O3:Fe ( β-ALUMINA ) | — | 0.27 | 1.15 | 23 | 260 |
| EXAMPLE 13 | Na-nAl2O3:Fe ( CALCINED ALUMINA ) | — | 0.42 | 1.11 | 8 | 210 |

| ITEM | COMPOSITION | RAW MATERIAL COMPOSITION | | | | |
|---|---|---|---|---|---|---|
| | | CaCO3 (g) | Na2CO3 (g) | Al2O3 (g) | FeCl2·4H2O (mg) | FLUX (mg) |
| EXAMPLE 14 | CaAl12O19:Fe ( β-ALUMINA ) | 0.23 | — | 1.59 | 8 | 59 |

| ITEM | COMPOSITION | RAW MATERIAL COMPOSITION | | | | |
|---|---|---|---|---|---|---|
| | | SrCO3 (g) | Na2CO3 (g) | Al2O3 (g) | FeCl2·4H2O (mg) | FLUX (mg) |
| EXAMPLE 15 | SrAl12O19:Fe ( β-ALUMINA ) | 0.34 | — | 1.59 | 8 | 59 |

[FIG. 3]

| ITEM | COMPOSITION | CALCINING CONDITION | | |
|---|---|---|---|---|
| | | CALCINING ATMOSPHERE | CALCINING TEMPERATURE (°C) | CALCINING TIME (h) |
| COMPARATIVE EXAMPLE 1 | BaAl12O19:Fe (α-ALUMINA) | ATMOSPHERIC AIR | 1200 | 2 |
| COMPARATIVE EXAMPLE 2 | BaAl12O19:Fe (CALCINED ALUMINA) | ATMOSPHERIC AIR | 1200 | 2 |
| COMPARATIVE EXAMPLE 3 | BaAl12O19:Fe (CALCINED ALUMINA) | ATMOSPHERIC AIR | 1450 | 2 |
| COMPARATIVE EXAMPLE 4 | BaAl12O19:Fe (CALCINED ALUMINA) | ATMOSPHERIC AIR | 1450 | 2 |
| COMPARATIVE EXAMPLE 5 | BaAl12O19:Fe (CALCINED ALUMINA) | ATMOSPHERIC AIR | 1450 | 2 |
| COMPARATIVE EXAMPLE 6 | BaAl12O19:Fe (CALCINED ALUMINA) | ATMOSPHERIC AIR | 1450 | 2 |
| COMPARATIVE EXAMPLE 7 | BaAl12O19:Fe (CALCINED ALUMINA) | ATMOSPHERIC AIR | 1450 | 2 |
| COMPARATIVE EXAMPLE 8 | BaAl12O19:Fe (CALCINED ALUMINA) | ATMOSPHERIC AIR | 1450 | 2 |
| COMPARATIVE EXAMPLE 9 | BaAl12O19:Fe (CALCINED ALUMINA) | ATMOSPHERIC AIR | 1450 | 2 |
| COMPARATIVE EXAMPLE 10 | Na-nAl2O3:Fe (FUSED ALUMINA) | ATMOSPHERIC AIR | 1450 | 2 |
| COMPARATIVE EXAMPLE 11 | Na-nAl2O3:Fe (FUSED ALUMINA) | ATMOSPHERIC AIR | 1450 | 2 |
| COMPARATIVE EXAMPLE 12 | Na-nAl2O3:Fe (β-ALUMINA) | ATMOSPHERIC AIR | 1450 | 2 |
| EXAMPLE 1 | BaAl12O19:Fe (β-ALUMINA) | ATMOSPHERIC AIR | 1450 | 2 |
| EXAMPLE 2 | BaAl12O19:Fe (β-ALUMINA) | ATMOSPHERIC AIR | 1450 | 2 |
| EXAMPLE 3 | BaAl12O19:Fe (β-ALUMINA) | ATMOSPHERIC AIR | 1450 | 2 |
| EXAMPLE 4 | BaAl12O19:Fe (β-ALUMINA) | ATMOSPHERIC AIR | 1450 | 2 |
| EXAMPLE 5 | BaAl12O19:Fe (β-ALUMINA) | ATMOSPHERIC AIR | 1450 | 2 |
| EXAMPLE 6 | Na-nAl2O3:Fe (β-ALUMINA) | ATMOSPHERIC AIR | 1450 | 2 |
| EXAMPLE 7 | Na-nAl2O3:Fe (β-ALUMINA) | ATMOSPHERIC AIR | 1450 | 2 |
| EXAMPLE 8 | Na-nAl2O3:Fe (β-ALUMINA) | ATMOSPHERIC AIR | 1450 | 2 |
| EXAMPLE 9 | Na-nAl2O3:Fe (β-ALUMINA) | ATMOSPHERIC AIR | 1450 | 2 |
| EXAMPLE 10 | Na-nAl2O3:Fe (β-ALUMINA) | ATMOSPHERIC AIR | 1450 | 2 |
| EXAMPLE 11 | Na-nAl2O3:Fe (β-ALUMINA) | ATMOSPHERIC AIR | 1350 | 2 |
| EXAMPLE 12 | Na-nAl2O3:Fe (β-ALUMINA) | ATMOSPHERIC AIR | 1500 | 2 |
| EXAMPLE 13 | Na-nAl2O3:Fe (CALCINED ALUMINA) | ATMOSPHERIC AIR | 1450 | 2 |

| ITEM | COMPOSITION | CALCINING CONDITION | | |
|---|---|---|---|---|
| | | CALCINING ATMOSPHERE | CALCINING TEMPERATURE (°C) | CALCINING TIME (h) |
| EXAMPLE 14 | CaAl12O19:Fe (β-ALUMINA) | ATMOSPHERIC AIR | 1450 | 2 |

| ITEM | COMPOSITION | CALCINING CONDITION | | |
|---|---|---|---|---|
| | | CALCINING ATMOSPHERE | CALCINING TEMPERATURE (°C) | CALCINING TIME (h) |
| EXAMPLE 15 | SrAl12O19:Fe (β-ALUMINA) | ATMOSPHERIC AIR | 1450 | 2 |

[FIG. 4]

| ITEM | COMPOSITION | GRAIN DIAMETER (μm) | QUANTUM EFFICIENCY (%) | ABSORPTION RATE (%) | LIGHT EMISSION WAVELENGTH (nm) | LIGHT EMISSION INTENSITY (a.u.) |
|---|---|---|---|---|---|---|
| COMPARATIVE EXAMPLE 1 | BaAl12O19:Fe (α-ALUMINA) | — | 1 | 10 | — | — |
| COMPARATIVE EXAMPLE 2 | BaAl12O19:Fe (CALCINED ALUMINA) | — | 17 | 61 | 790 | 178 |
| COMPARATIVE EXAMPLE 3 | BaAl12O19:Fe (CALCINED ALUMINA) | — | 40 | 35 | 788 | 255 |
| COMPARATIVE EXAMPLE 4 | BaAl12O19:Fe (CALCINED ALUMINA) | — | 73 | 26 | 787 | 327 |
| COMPARATIVE EXAMPLE 5 | BaAl12O19:Fe (CALCINED ALUMINA) | — | 71 | 29 | 785 | 361 |
| COMPARATIVE EXAMPLE 6 | BaAl12O19:Fe (CALCINED ALUMINA) | 6.5 | 104 | 16 | 787 | 264 |
| COMPARATIVE EXAMPLE 7 | BaAl12O19:Fe (CALCINED ALUMINA) | — | 112 | 15 | 788 | 301 |
| COMPARATIVE EXAMPLE 8 | BaAl12O19:Fe (CALCINED ALUMINA) | — | 119 | 12 | 784 | 262 |
| COMPARATIVE EXAMPLE 9 | BaAl12O19:Fe (CALCINED ALUMINA) | — | 121 | 8 | 783 | 177 |
| COMPARATIVE EXAMPLE 10 | Na-nAl2O3:Fe (FUSED ALUMINA) | — | 3 | 40 | 766 | 27 |
| COMPARATIVE EXAMPLE 11 | Na-nAl2O3:Fe (FUSED ALUMINA) | — | 20 | 35 | 772 | 135 |
| COMPARATIVE EXAMPLE 12 | Na-nAl2O3:Fe (β-ALUMINA) | 5.9 | 2 | 17 | 779 | 18 |
| EXAMPLE 1 | BaAl12O19:Fe (β-ALUMINA) | 5.3 | 69 | 46 | 771 | 556 |
| EXAMPLE 2 | BaAl12O19:Fe (β-ALUMINA) | 3.7 | 52 | 55 | 777 | 511 |
| EXAMPLE 3 | BaAl12O19:Fe (β-ALUMINA) | 2.6 | 52 | 54 | 775 | 494 |
| EXAMPLE 4 | BaAl12O19:Fe (β-ALUMINA) | 2.4 | 90 | 31 | 771 | 503 |
| EXAMPLE 5 | BaAl12O19:Fe (β-ALUMINA) | 3.2 | 79 | 38 | 769 | 533 |
| EXAMPLE 6 | Na-nAl2O3:Fe (β-ALUMINA) | 4.7 | 76 | 37 | 770 | 503 |
| EXAMPLE 7 | Na-nAl2O3:Fe (β-ALUMINA) | 2.2 | 88 | 26 | 773 | 413 |
| EXAMPLE 8 | Na-nAl2O3:Fe (β-ALUMINA) | 3.8 | 90 | 34 | 770 | 530 |
| EXAMPLE 9 | Na-nAl2O3:Fe (β-ALUMINA) | 3.7 | 45 | 79 | 771 | 646 |
| EXAMPLE 10 | Na-nAl2O3:Fe (β-ALUMINA) | 4.2 | 56 | 43 | 771 | 439 |
| EXAMPLE 11 | Na-nAl2O3:Fe (β-ALUMINA) | 3.3 | 61 | 40 | 771 | 464 |
| EXAMPLE 12 | Na-nAl2O3:Fe (β-ALUMINA) | 4.8 | 63 | 59 | 771 | 682 |
| EXAMPLE 13 | Na-nAl2O3:Fe (CALCINED ALUMINA) | — | 78 | 31 | 770 | 410 |
| EXAMPLE 14 | CaAl12O19:Fe (β-ALUMINA) | — | 98 | 25 | 767 | 469 |
| EXAMPLE 15 | SrAl12O19:Fe (β-ALUMINA) | — | 99 | 28 | 771 | 478 |

[FIG. 5]
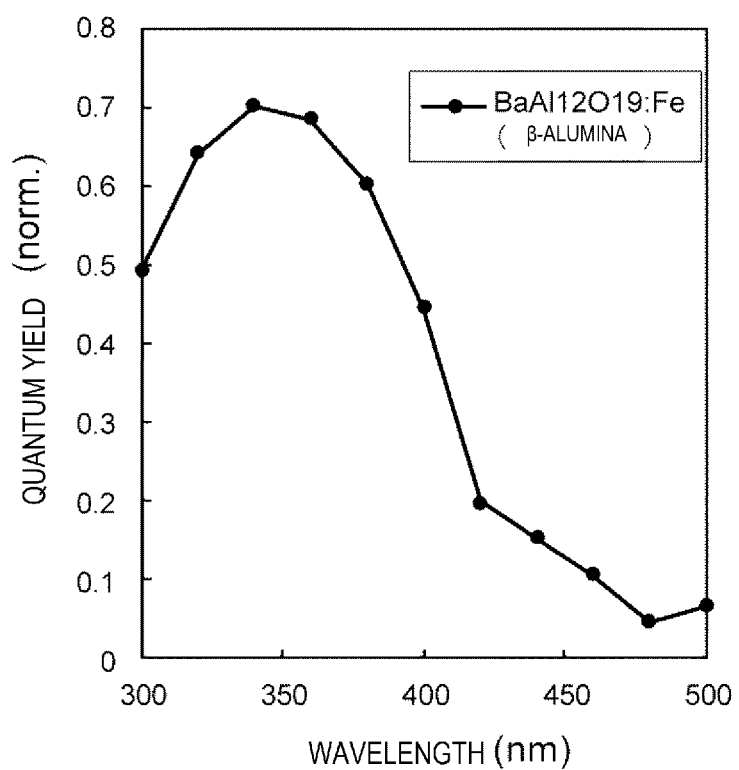

[FIG. 6]
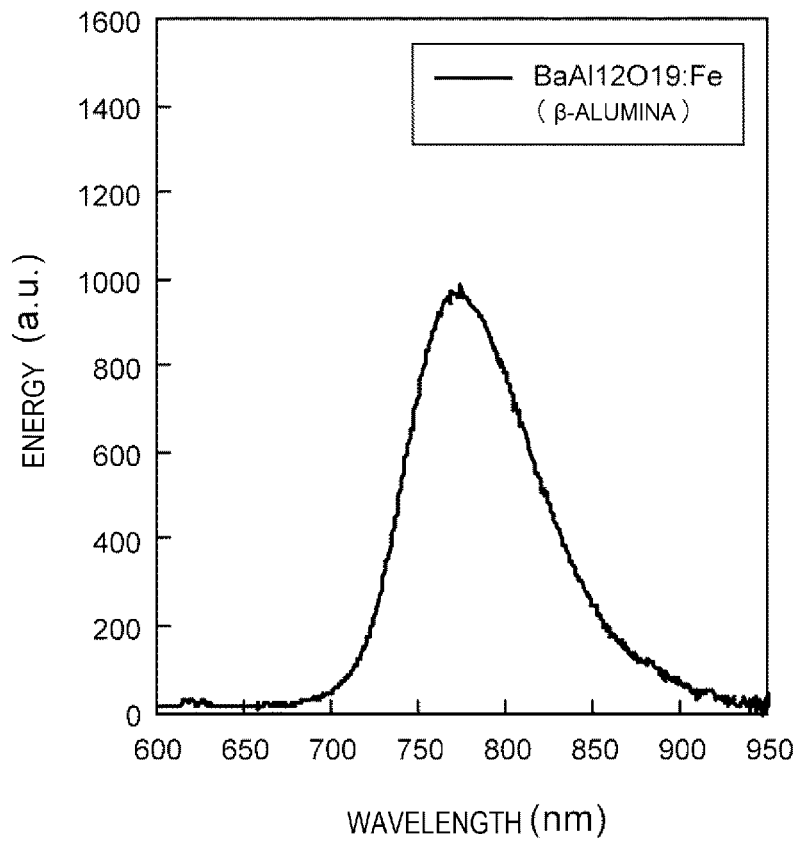
[FIG. 7]
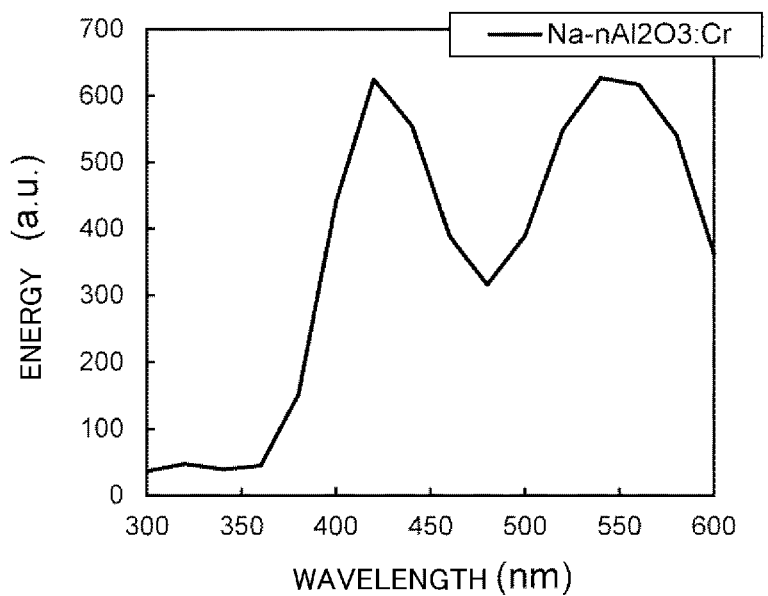

[FIG. 8]
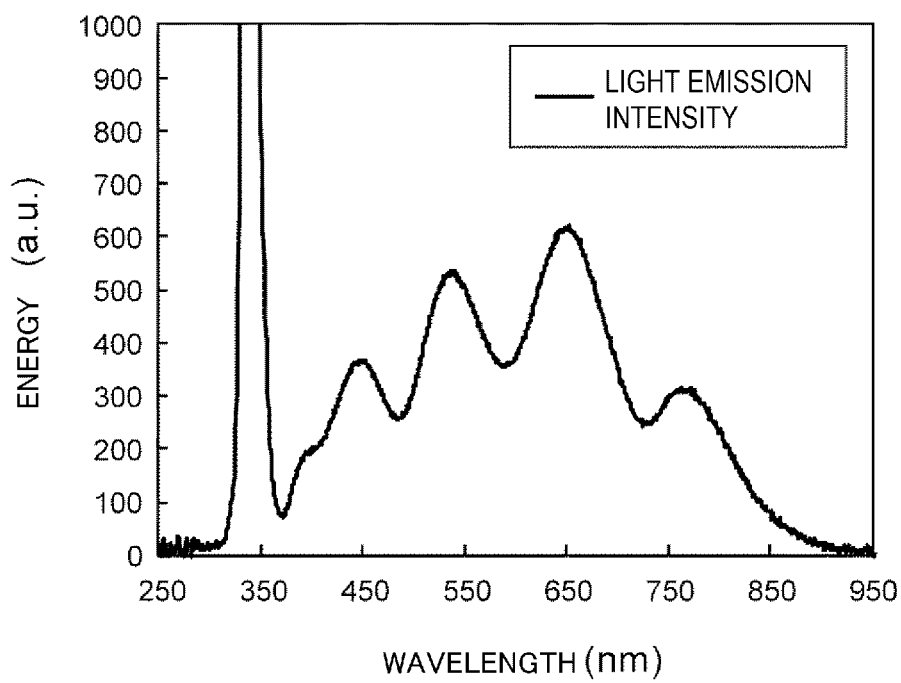
FIG. 9A    FIG. 9B
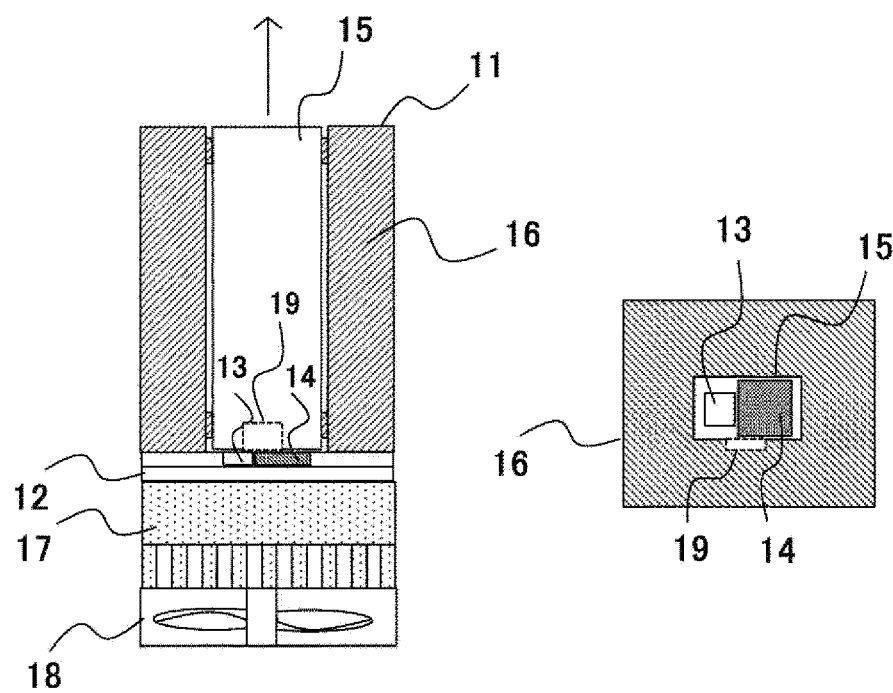

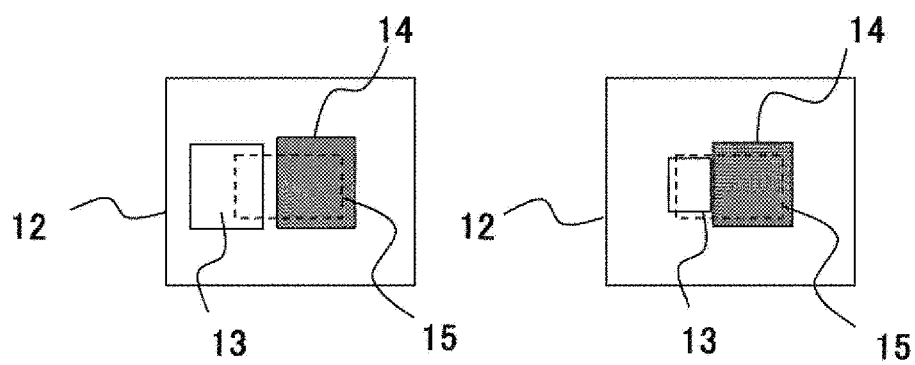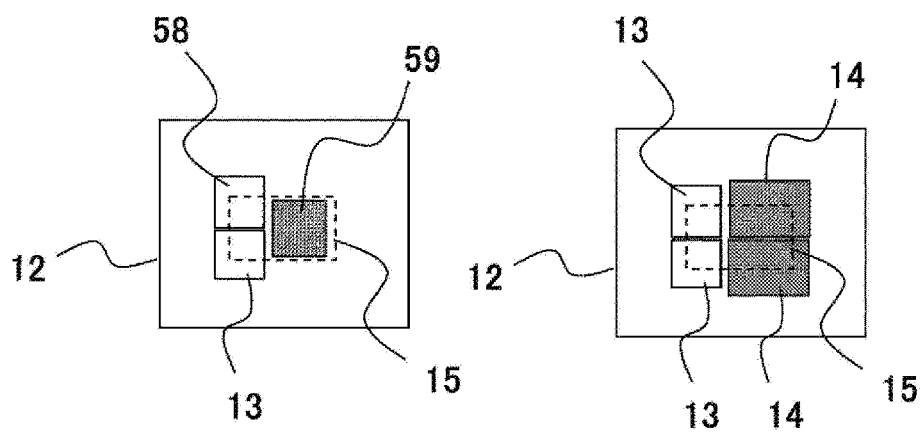

[FIG. 11]
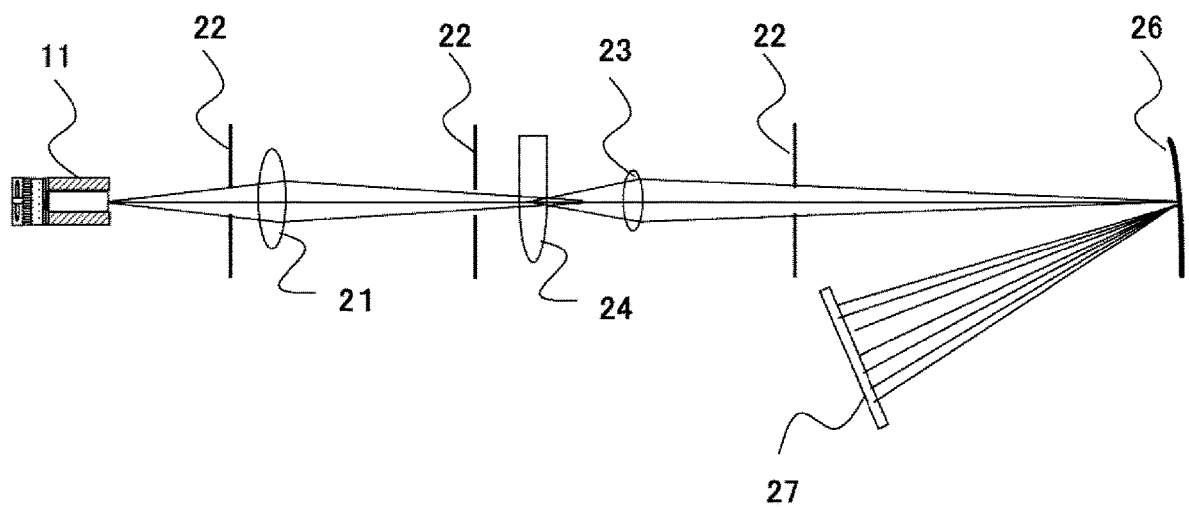

[FIG. 14]
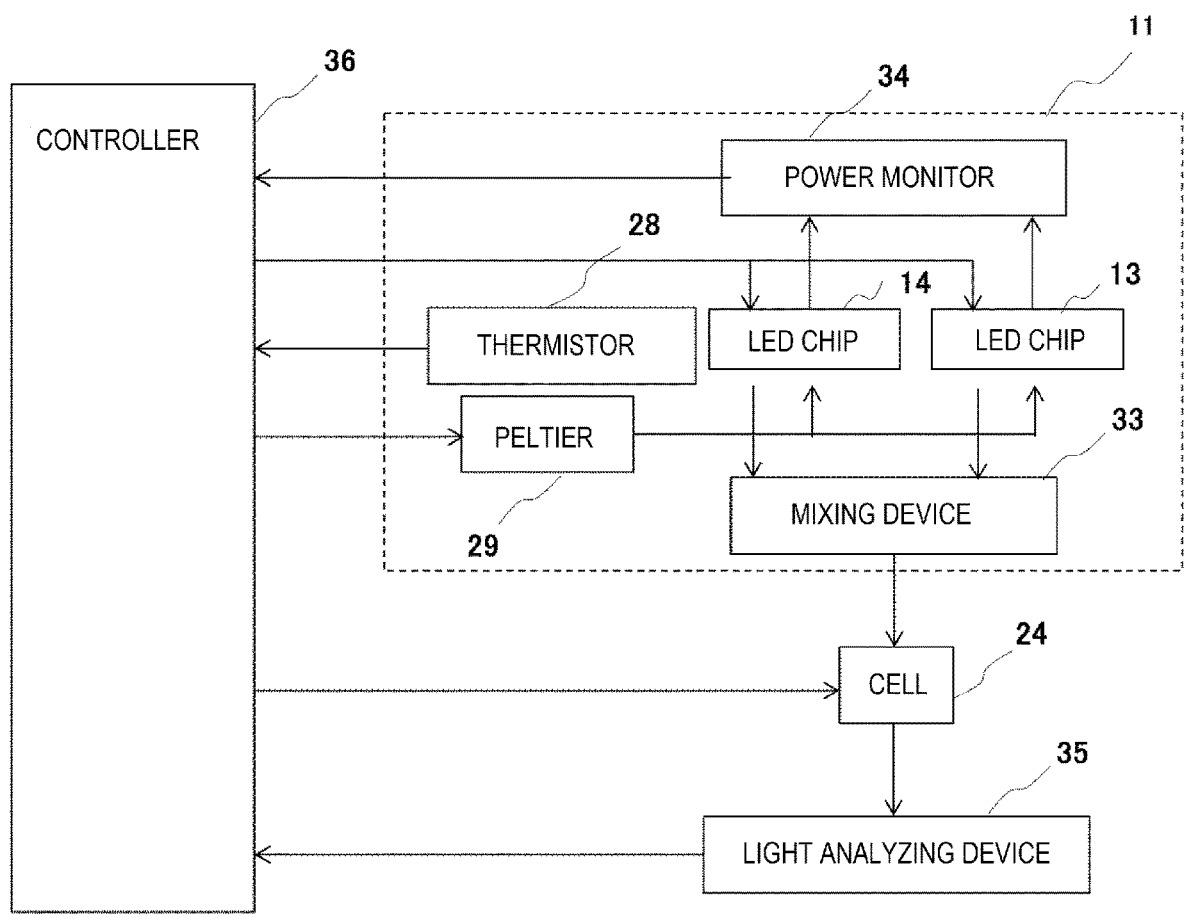

[FIG. 15]
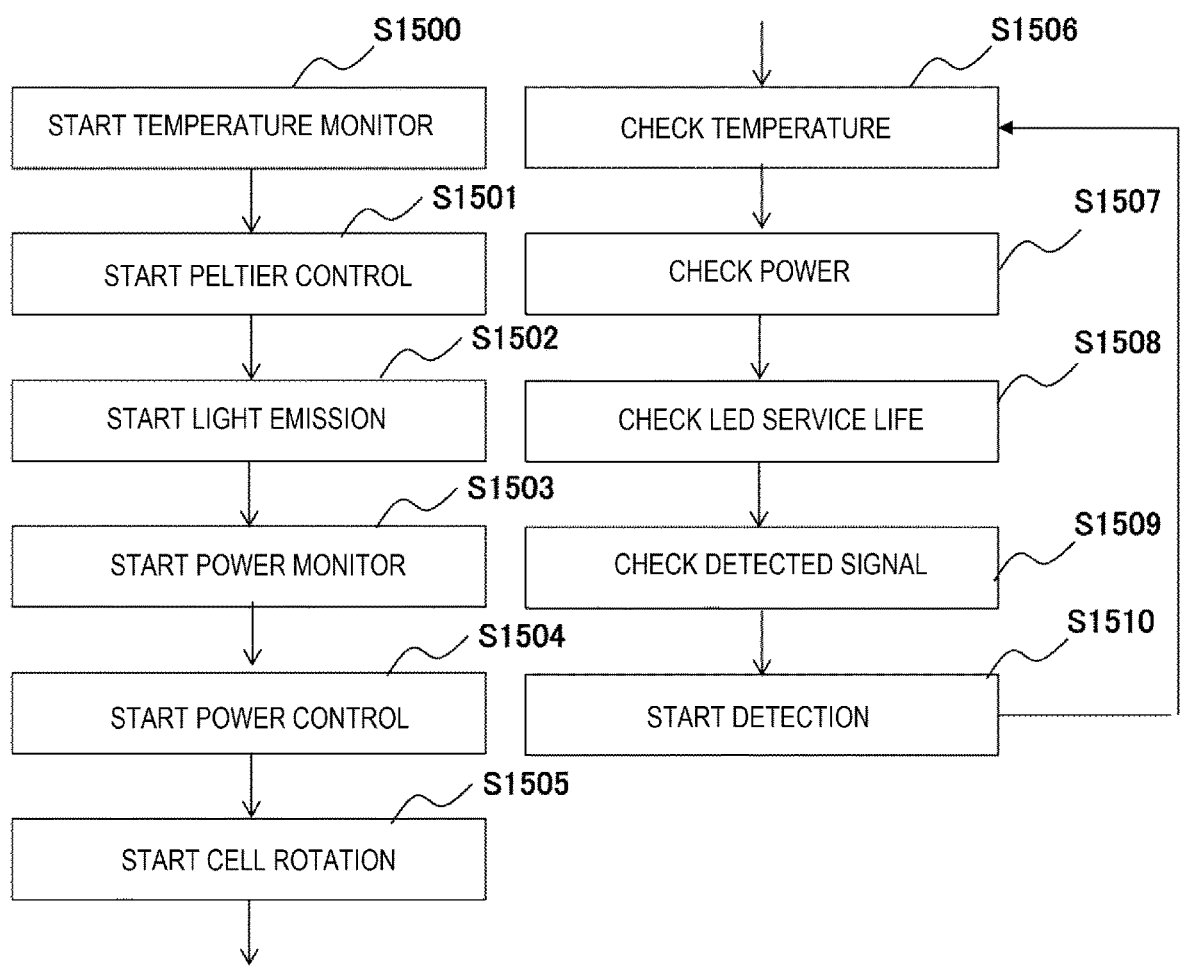

[FIG. 18]
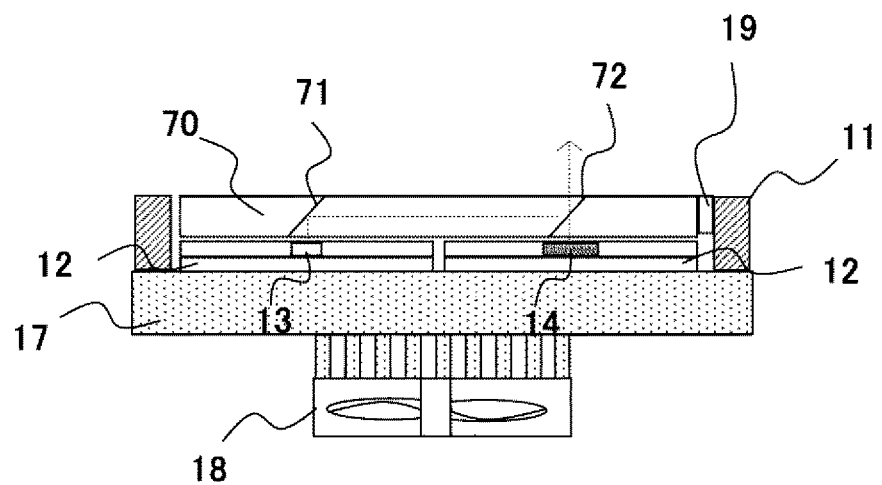

[FIG. 19]
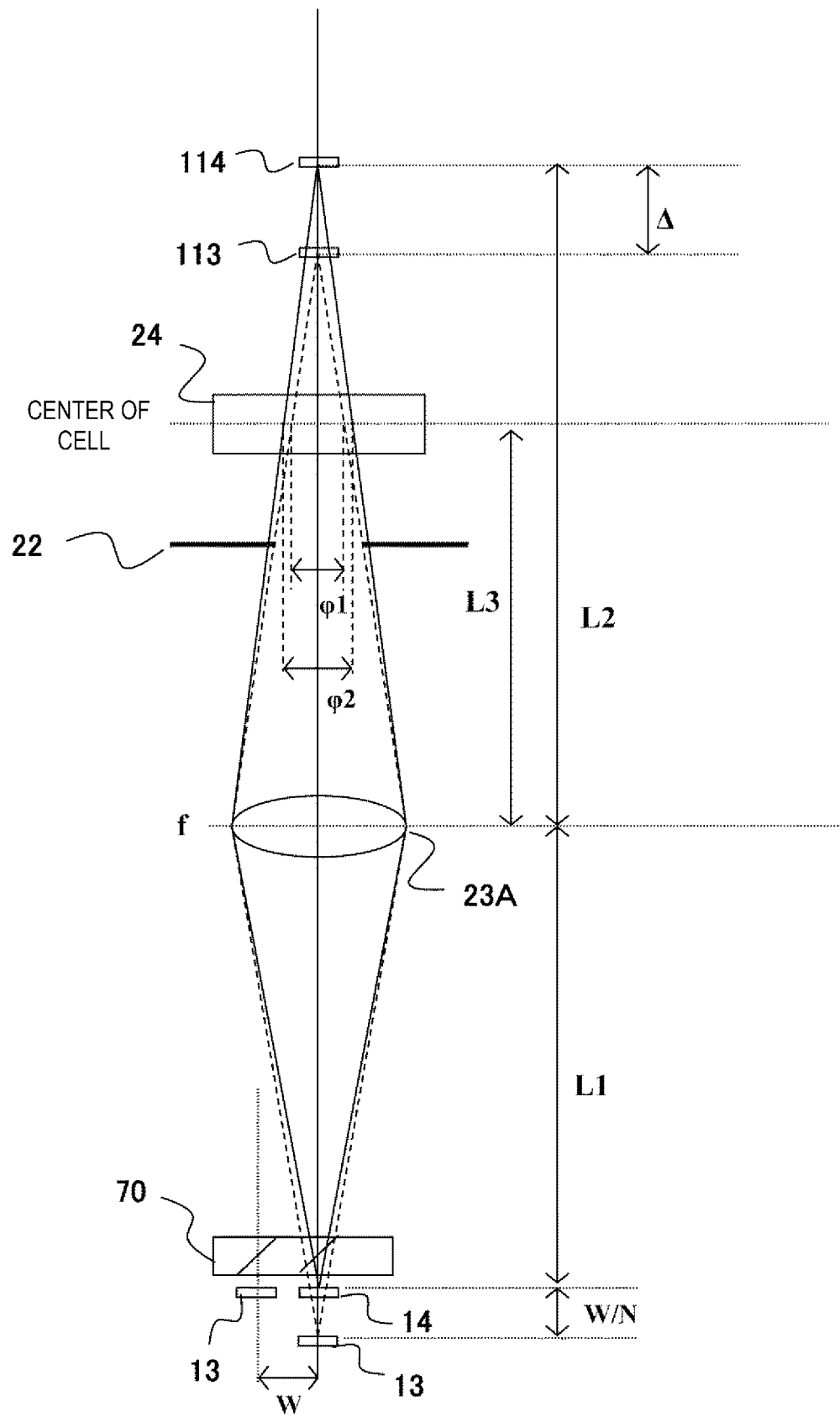

[FIG. 20]
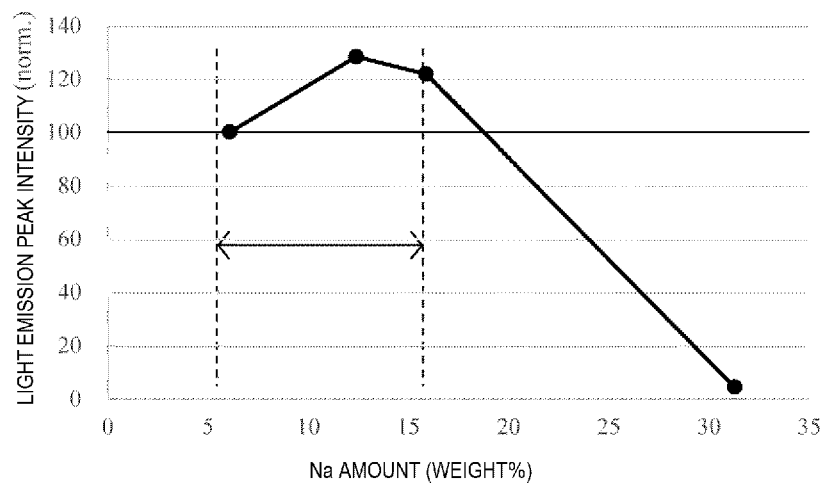
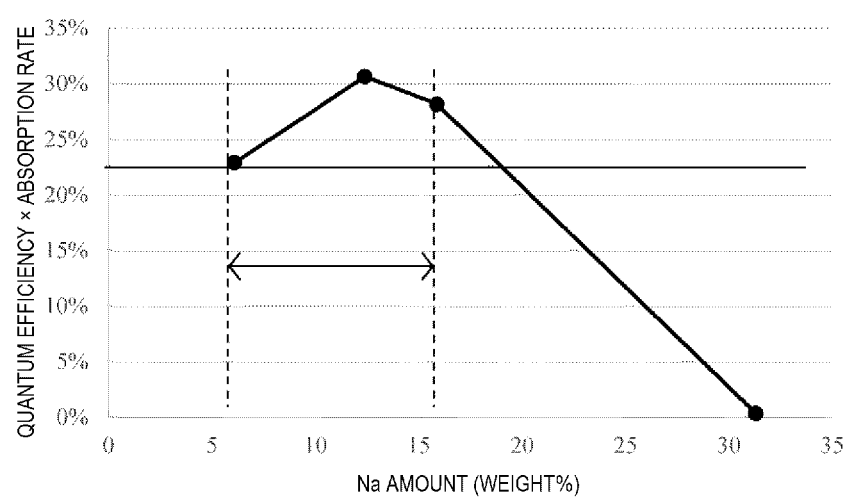

BROADBAND LIGHT SOURCE DEVICE AND BIOCHEMICAL ANALYZING DEVICE

TECHNICAL FIELD

The present invention relates to a biochemical analyzing device, and more particularly to a broadband light source technology utilized in biochemical analysis.

BACKGROUND ART

In a biochemical analyzing device, a reagent is added to a biochemical sample, followed by irradiating the sample with light, whereby the concentration of the biochemical sample is observed by measuring the light emission intensity. In the biochemical analyzing device, the wavelength range of light to irradiate the sample therewith is a wide wavelength range of 340 to 800 nm, and a light source that can emit light in this wavelength range is used.

In recent years, LEDs (Light Emitting Diodes) that emit near ultraviolet light have been developed and used as light sources for sample analysis. The biochemical analyzing device analyzes samples using light in a wide wavelength range of 340 to 800 nm, as described above. To utilize the LEDs described above, it is necessary to use fluorescent substances that are excited with near ultraviolet light and emit light with wavelengths up to the near-infrared wavelength range.

Patent Literature 1 discloses a fluorescent substance that is excited with a near ultraviolet light LED and emits near infrared light. Specifically, as examples of the above-described fluorescent substances, Patent Literature 1 discloses $LiAlO_2$:Fe (peak wavelength of an emission spectrum: 746 nm) and $Al_2O_3$:Cr (no description of light emission wavelength), which emit infrared light in light-emitting devices (see Abstract, paragraph 0066, and FIG. 3).

In addition, Patent Literature 2 discloses $LiGaO_2$:Fe as a fluorescent component that emits near infrared light. Further, Patent Literature 3 discloses, as a preferred example, a technology for using a fluorescent substance (BAM) that has an average grain diameter of 5 μm or less and is excited with ultraviolet light, in a light-emitting device (see paragraph 0026). This fluorescent substance emits visible light (see paragraph 0021 and Table 3).

Furthermore, Patent Document 4 describes an example of an endoscope light source device that combines light emitted from a plurality of LDs (Laser Diodes).

Non-Patent Literature 1 discloses a crystal synthesis method of fluorescent substances using $Al_2(SO_4)_3 \cdot 18H_2O$ as a raw material. In addition, Non-Patent Literature 2 discloses a synthesis example of fluorescent substances using dissolved metallic Al as a starting raw material. Further, Non-Patent Literature 3 describes an example of synthesizing fluorescent substances using AlOOH or $Al(NO_3) \cdot 9H_2O$ as a starting material.

CITATION LIST

Patent Literature

Patent Literature 1: Japanese Unexamined Patent Application Publication No. 2001-352101
Patent Literature 2: Japanese Unexamined Patent Application Publication No. 2015-60921
Patent Literature 3: Japanese Unexamined Patent Application Publication No. 2016-103556
Patent Literature 4: WO16/006371

Non-Patent Literature

Non-Patent Literature 1: React. Kinet. Catal. Lett. Vol. 86, No. 2, 299-306 (2005)
Non-Patent Literature 2: J. Electrochem. Soc. Vol. 147, No. 11, 4368-4373 (2000)
Non-Patent Literature 3: Displays Vol. 19, 197-203 (1999)

SUMMARY OF INVENTION

Problem to be Solved by the Invention

As mentioned above, in order to use an LED light source instead of using a tungsten lamp with short lamp service life as a light source for a biochemical analyzing device, it is necessary to achieve a broadband of 340 nm to 800 nm.

As near-infrared light-emitting fluorescent substances, $LiAlO_2$:Fe, $Al_2O_3$:Cr, etc., are known. However, these fluorescent substances do not have many excitation bands in the near-ultraviolet region (in a wavelength range of about 300 nm to 405 nm). Therefore, in the case of using a light source composed of a combination of a near-ultraviolet light-emitting LEDs and fluorescent substances, there is a problem that the light emission intensity of near infrared light becomes low.

The present invention has been made to solve the above-described problems, and an object of the present invention is to provide a technology that improves service life and performance of a biochemical analyzing device and facilitate maintenance thereof by realizing a light source device that achieves a broadband of 340 nm to 800 nm using an LED.

Solution to Problem

To achieve the above-described object, in the present invention, a broadband light source device is provided which includes: a first LED chip that generates a light beam having a first wavelength band; a fluorescent substance that is provided in the light beam of the first LED chip; and a second LED chip that generates a light beam having a second wavelength band, in which the fluorescent substance includes at least alumina and at least one of Fe, Cr, Bi, Tl, Ce, Tb, Eu, and Mn and is produced by calcining a raw material that contains sodium at 6.1 to 15.9 wt. % in the whole raw material, and the light beam from the fluorescent substance and the light beam from the second LED chip are color-mixed.

Further, to achieve the above-described object, in the present invention, a broadband light source device is provided which includes: an LED substrate that is provided with a first LED chip generating a light beam having a first wavelength band and including a fluorescent substance in the light beam having a first wavelength band, and a second LED chip generating a light beam having a second wavelength band; and a flat dichroic prism disposed on the LED substrate, and which allows the light beam from the fluorescent substance to pass therethrough and reflects the light beam from the second LED chip twice so as to substantially align optical axes of the two light beams.

Furthermore, to achieve the above-described object, in the present invention, a biochemical analyzing device is provided which includes:

an inspection cell; a broadband light source device that includes a first LED chip generating a light beam having a first wavelength band, a fluorescent substance provided in the light beam of the first LED chip, a second LED chip generating a light beam having a second wavelength band, and a flat dichroic prism which allows the light beam from the fluorescent substance to pass therethrough and reflects the light beam from the second LED chip twice so as to substantially align optical axes of the two light beams; and a lens through which the light beam emitted from the flat dichroic prism illuminates the inspection cell, in which the lens satisfies a relationship of $W/N<k$ $(L1-k\cdot L3)$, $k=L1/f-1$, with a distance between centers of the first LED chip and the second LED chip being W, a refractive index of the flat dichroic prism being N, a focal distance of the lens being f, an interval between the lens and the second LED chip being L1, and an interval between the lens and the inspection cell being L3.

Advantageous Effects of Invention

According to the present invention, the service life and performance of the broadband light source device of an analyzing device can be improved, and the maintenance of the broadband light source device and the biochemical analyzing device can be facilitated.

BRIEF DESCRIPTION OF DRAWINGS

FIG. 1 illustrates a basic configuration of a light source used in a biochemical analyzing device.

FIG. 2 shows a raw material composition table of fluorescent substances according to examples and comparative examples.

FIG. 3 shows a calcining condition table of the fluorescent substances according to the examples and the comparative examples.

FIG. 4 shows a characteristics table of the fluorescent substances according to the examples and the comparative examples.

FIG. 5 shows an excitation spectrum of a near-infrared light-emitting fluorescent substance.

FIG. 6 shows a light emitting spectrum of the near-infrared light-emitting fluorescent substance when excited with near ultraviolet light.

FIG. 7 shows an excitation spectrum of a near-infrared light-emitting fluorescent substance.

FIG. 8 shows a light emitting spectrum of a light source according to a configuration example 1.

FIGS. 9A and 9B are schematic views illustrating a broadband light source device according to an example.

FIGS. 10A-10D are schematic views illustrating an LED substrate according to the example.

FIG. 11 is a schematic view illustrating an optical system of a biochemical analyzing device according to the example.

FIG. 14 is a system block diagram of the biochemical analyzing device according to the example.

FIG. 15 is an operation block diagram of the biochemical analyzing device according to the example.

FIG. 18 is a schematic view illustrating a modified example of a broadband light source device according to an example.

FIG. 19 is a schematic view illustrating an optical system up to an inspection cell according to the example.

FIG. 20 shows a relationship between Na content and light emitting peak intensity and a relationship between Na content and quantum efficiency×absorption rate according to examples.

DESCRIPTION OF EMBODIMENTS

Figure 12A:
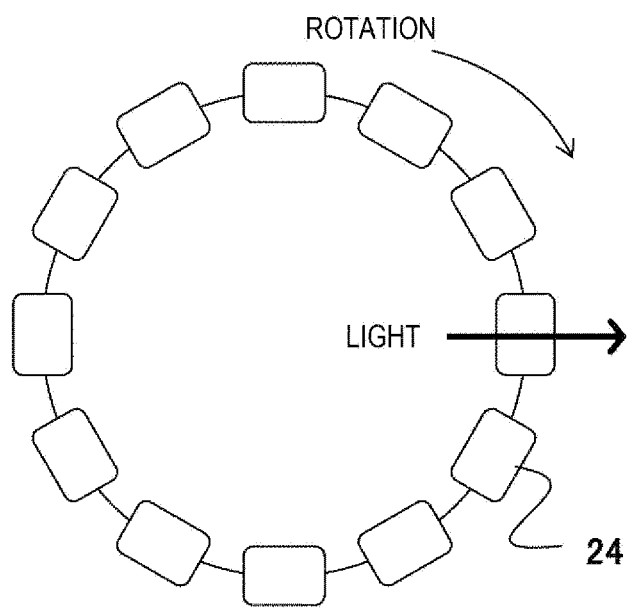
FIGS. 12A and 12B are schematic views illustrating LED light emitting control according to the example.

Hereinafter, various examples of the present invention will be described with reference to the accompanying drawings. It is noted that the present invention is not limited to examples described below, and various variations can be made to the examples within the scope of its technical concept. The corresponding parts of each drawing used in the explanation of the various examples described below are indicated with the same sign, and duplicate explanations thereof are omitted.

<Configuration of Light Source Used in Biochemical Analyzing Device>

FIG. 1 illustrates a basic configuration of a light source used in a biochemical analyzing device. A light source 1 is composed of an LED module 2, a transparent resin 3, an LED element 4, a heat dissipating plate 5, and a wire 6. The LED element 4 includes a plurality of LED chips with different light emission wavelengths. A plurality of kinds of fluorescent substances 7 are mixed in the transparent resin. Here, among the plurality of kinds of fluorescent substances 7, a fluorescent substance of the present disclosure described later is included.

Here, it is ideal to use a single LED chip in the LED module 2 from the viewpoint of suppressing uneven luminance. However, the LED module 2 can also be configured to use a plurality of LED chips that emit light having a wavelength of 340 nm to improve the power of light emission. LED chips having different light emission wavelengths, such as an LED chip that emits light having a wavelength of 340 nm and an LED chip that emits light having a wavelength of 405 nm, can be combined to configure the LED element 4, and this LED element 4 can be incorporated into the LED module 2.

As for the transparent resin 3, when the light allowed to pass through is visible light, silicone resin is mainly used. If the light allowed to pass through is near ultraviolet light, a fluororesin or the like that allows the near ultraviolet light to pass therethrough can be used. These transparent resins are easy to mix with fluorescent substances and can be solidified by calcining at a temperature of about 250° C. or lower.

The transparent resin 3 with the fluorescent substances 7 mixed therein may be placed directly on the LED element 4 or on quartz glass or the like that allows near ultraviolet light to pass therethrough, and installed in a path of the eradiated LED light. Before placing the resin layer, a silane coupling agent or the like can be applied onto the LED element 4 or on the quartz glass to improve the adhesion of the resin layer.

The LED module 2 may be formed in the form of a single layer of transparent resin, or it may be formed in the form of multiple layers obtained by laminating a plurality of layers while changing the kind of a fluorescent substance to be mixed for each layer. The transparent resin may also contain light scattering material particulates.

A reflective material (not shown) may also be provided between the resin layer and a wall surface of the LED module 2. By providing the transparent resin with the fluorescent substances 7 mixed therein in a light emitting region of the LED element 4 as described above, LED light strikes the fluorescent substance 7, causing light with near-ultraviolet to blue wavelengths to be converted into light with visible to near-infrared wavelengths. Thus, the light emitted from the fluorescent substance 7 is eradiated from the light source 1, together with the original LED light.

Since the surroundings of the LED module 2, especially the LED element 4, become hot, the heat dissipating plate 5 may be provided. A water-cooled or air-cooled cooling mechanism may also be provided on the opposite side to the LED module 2 of the heat dissipating plate. The efficiency with which the fluorescent substance 7 absorbs the light having near-ultraviolet to blue wavelengths and emits light tends to decrease in some cases when the temperature of the fluorescent substances 7 increases. For this reason, the light source 1 is desirably provided with the cooling mechanism as described above.

The light source 1 with such a configuration excites the fluorescent substances with the LED light (near-ultraviolet to blue wavelengths), so that light in the wavelength range of 340 to 800 nm is eradiated from the light source 1 through the use of the LED light and the wavelength-converted light eradiated from the fluorescent substances. In the biochemical analyzing device to which the above-described light source 1 is applied, the absorption of light (amount of light passing) through a sample cell can be monitored by a light receiver.

<Synthesis of Near-Infrared Light-Emitting Fluorescent Substance>

A near-infrared light-emitting fluorescent substance is synthesized, and the synthesized fluorescent substance is mixed in a transparent resin to fabricate a light source used in a biochemical analyzing device. Hereinafter, the fluorescent substances of comparative examples 1 to 12 and examples 1 to 15 are described with reference to FIGS. 2 to 4. FIG. 2 shows a raw material composition table of the fluorescent substances of the comparative examples and the examples. FIG. 3 shows a calcining condition table of the fluorescent substances of the comparative examples and the examples. FIG. 4 shows a characteristics table of the fluorescent substances according to the examples and the comparative examples.

Comparative Example 1

In Comparative Example 1, a fluorescent substance was synthesized using alpha alumina as a raw material. The raw material used when synthesizing the fluorescent substance was composed of 1.22 g of $BaCO_3$, 3.77 g of alpha alumina, 10 mg of $FeCl_2 \cdot 4H_2O$, and 5 mg of beam ($AlF_3$). These materials were mixed in a mortar, placed in an alumina crucible, and calcined at 1200° C. for 2 hours in an atmospheric atmosphere. After calcination and cooling, the calcined fluorescent substance was taken out and lightly crushed in the mortar to obtain the fluorescent substance.

The target fluorescent substance composition is $BaAl_{12}O_{19}$:Fe (α-alumina) (although it has been difficult to readily describe the exact composition ratio of $BaAl_{12}O_{19}$:Fe). $FeCl_2 \cdot 4H_2O$ used as the raw material is $Fe^{2+}$ and has bronze color, but it is oxidized in the air and changes to $Fe^{3+}$ of reddish brown color after the substances of the raw material are mixed in a mortar and left for about an hour.

The quantum efficiency and absorption rate were measured using a quantum yield measurement device when the fluorescent substance of Comparative Example 1 was excited with light having a wavelength of 340 nm. The results showed that the quantum efficiency was 1% and the absorption rate was 10%. Therefore, in a case where alpha alumina was used as the raw material to synthesize the fluorescent substance, the light emission from the fluorescent substance could hardly be confirmed.

Comparative Example 2

In Comparative Example 2, a fluorescent substance was synthesized using calcined alumina as a raw material. The calcined alumina was a product manufactured by SHINKO-SHA CO., LTD. (product name: S Powder) and was alumina fabricated by calcination. The raw material used when synthesizing the fluorescent substance was composed of 1.22 g of $BaCO_3$, 3.65 g of calcined alumina, 120 mg of $FeCl_2 \cdot 4H_2O$, and 5 mg of beam ($AlF_3$). These materials were mixed in a mortar, placed in an alumina crucible, and calcined at 1200° C. for 2 hours in an atmospheric atmosphere.

The quantum efficiency and absorption rate were measured using the quantum yield measurement device when the fluorescent substance of Comparative Example 2 was excited with light having a wavelength of 340 nm. The results showed that the quantum efficiency was 17%, the absorption rate was 61%, and the light emission intensity was 178. The fluorescent substance synthesized in Comparative Example 2 had a light emission peak at 790 nm. The light emission intensity is the intensity of light at the wavelength that demonstrates the light emission peak, and the unit of the light emission intensity is Energy (a.u.) in the quantum yield measurement device.

Comparative Example 3

In Comparative Example 3, a fluorescent substance was synthesized using calcined alumina as a raw material. The calcined alumina was a product manufactured by SHINKO-SHA CO., LTD. and was alumina fabricated by calcination. The raw material used when synthesizing the fluorescent substance was composed of 0.47 g of $BaCO_3$, 1.45 g of calcined alumina, 47 mg of $FeCl_2 \cdot 4H_2O$, and 27 mg of beam ($AlF_3$). These materials were mixed in a mortar, placed in an alumina crucible, and calcined at 1450° C. for 2 hours in an atmospheric atmosphere.

The quantum efficiency and absorption rate were measured using a quantum yield measurement device when the fluorescent substance of Comparative Example 3 was excited with light having a wavelength of 340 nm. The results showed that the quantum efficiency was 40%, the absorption rate was 35%, and the light emission intensity was 255. The fluorescent substance synthesized in Comparative Example 3 had a light emission peak at 788 nm.

Comparative Example 4

In Comparative Example 4, a fluorescent substance was synthesized using calcined alumina as a raw material. The calcined alumina was a product manufactured by SHINKO-SHA CO., LTD. and was alumina fabricated by calcination. The raw material used when synthesizing the fluorescent substance was composed of 0.43 g of $BaCO_3$, 1.49 g of calcined alumina, 24 mg of $FeCl_2 \cdot 4H_2O$, and 55 mg of beam ($AlF_3$). These materials were mixed in a mortar, placed in an alumina crucible, and calcined at 1450° C. for 2 hours in an atmospheric atmosphere.

The quantum efficiency and absorption rate were measured using a quantum yield measurement device when the fluorescent substance of Comparative Example 5 was excited with light having a wavelength of 340 nm. The results showed that the quantum efficiency was 73%, the absorption rate was 26%, and the light emission intensity was 327. The fluorescent substance synthesized in Comparative Example 4 had a light emission peak at 787 nm.

Comparative Example 5

In Comparative Example 5, a fluorescent substance was synthesized using calcined alumina as a raw material. The calcined alumina was a product manufactured by SHINKO-SHA CO., LTD. and was alumina fabricated by calcination. The raw material used when synthesizing the fluorescent substance was composed of 0.38 g of $BaCO_3$, 1.48 g of calcined alumina, 24 mg of $FeCl_2 \cdot 4H_2O$, and 110 mg of beam ($AlF_3$). These materials were mixed in a mortar, placed in an alumina crucible, and calcined at 1450° C. for 2 hours in an atmospheric atmosphere.

The quantum efficiency and absorption rate were measured using a quantum yield measurement device when the fluorescent substance of Comparative Example 5 was excited with light having a wavelength of 340 nm. The results showed that the quantum efficiency was 718%, the absorption rate was 29%, and the light emission intensity was 361. The fluorescent substance synthesized in Comparative Example 5 had a light emission peak at 785 nm.

Comparative Example 6

In Comparative Example 6, a fluorescent substance was synthesized using calcined alumina as a raw material. The calcined alumina was a product manufactured by SHINKO-SHA CO., LTD. and was alumina fabricated by calcination. The raw material used when synthesizing the fluorescent substance was composed of 0.39 g of $BaCO_3$, 1.49 g of calcined alumina, 8 mg of $FeCl_2 \cdot 4H_2O$, and 110 mg of beam ($AlF_3$). These materials were mixed in a mortar, placed in an alumina crucible, and calcined at 1450° C. for 2 hours in an atmospheric atmosphere.

The quantum efficiency and absorption rate were measured using a quantum yield measurement device when the fluorescent substance of Comparative Example 6 was excited with light having a wavelength of 340 nm. The results showed that the quantum efficiency was 104%, the absorption rate was 16%, and the light emission intensity was 264. The fluorescent substance synthesized in Comparative Example 6 had a light emission peak at 787 nm.

Comparative Example 7

In Comparative Example 7, a fluorescent substance was synthesized using calcined alumina as a raw material. The calcined alumina was a product manufactured by SHINKO-SHA CO., LTD. and was alumina fabricated by calcination. The raw material used when synthesizing the fluorescent substance was composed of 0.48 g of $BaCO_3$, 1.49 g of calcined alumina, 10 mg of $FeCl_2 \cdot 4H_2O$, and 25 mg of beam ($AlF_3$). These raw materials were mixed in a mortar, placed in an alumina crucible, and calcined at 1450° C. for 2 hours in an atmospheric atmosphere.

The quantum efficiency and absorption rate were measured using a quantum yield measurement device when the fluorescent substance of Comparative Example 7 was excited with light having a wavelength of 340 nm. The results showed that the quantum efficiency was 112%, the absorption rate was 15%, and the light emission intensity was 301. The fluorescent substance synthesized in Comparative Example 7 had a light emission peak at 788 nm.

Comparative Example 8

In Comparative Example 8, a fluorescent substance was synthesized using calcined alumina as a raw material. The calcined alumina was a product manufactured by SHINKO-SHA CO., LTD. and was alumina fabricated by calcination. The raw material used when synthesizing the fluorescent substance was composed of 0.39 g of $BaCO_3$, 1.50 g of calcined alumina, 4.9 mg of $FeCl_2 \cdot 4H_2O$, and 111 mg of beam ($AlF_3$). These materials were mixed in a mortar, placed in an alumina crucible, and calcined at 1450° C. for 2 hours in an atmospheric atmosphere.

The quantum efficiency and absorption rate were measured using a quantum yield measurement device when the fluorescent substance of Comparative Example 8 was excited with light having a wavelength of 340 nm. The results showed that the quantum efficiency was 119%, the absorption rate was 12%, and the light emission intensity was 262. The fluorescent substance synthesized in Comparative Example 8 had a light emission peak at 784 nm.

Comparative Example 9

In Comparative Example 9, a fluorescent substance was synthesized using calcined alumina as a raw material. The calcined alumina was a product manufactured by SHINKO-SHA CO., LTD. and was alumina fabricated by calcination. The raw material used when synthesizing the fluorescent substance was composed of 0.39 g of $BaCO_3$, 1.50 g of calcined alumina, 2.5 mg of $FeCl_2 \cdot 4H_2O$, and 111 mg of beam ($AlF_3$). These materials were mixed in a mortar, placed in an alumina crucible, and calcined at 1450° C. for 2 hours in an atmospheric atmosphere.

The quantum efficiency and absorption rate were measured using a quantum yield measurement device when the fluorescent substance of Comparative Example 9 was excited with light having a wavelength of 340 nm. The results showed that the quantum efficiency was 121%, the absorption rate was 8%, and the light emission intensity was 177. The fluorescent substance synthesized in Comparative Example 9 had a light emission peak at 783 nm.

In Comparative Examples 2 to 9, calcined alumina was used as a raw material for alumina. In Comparative Examples 2 to 9, the amount of Fe added was mainly adjusted. The lower the amount of Fe added is, the higher the quantum efficiency and the lower the absorption rate become.

Comparative Example 10

In Comparative Example 10, a fluorescent substance was synthesized using fused alumina as a raw material. The fused alumina was a product manufactured by Kojundo Chemical Laboratory Co., Ltd. The raw material used when synthesizing the fluorescent substance was composed of 0.42 g of $Na_2CO_3$, 0.92 g of fused alumina, 36 mg of $FeCl_2 \cdot 4H_2O$, and 190 mg of beam ($BaCl_2$). These raw materials were mixed in a mortar, placed in an alumina crucible, and calcined at 1450° C. for 2 hours in an atmospheric atmosphere.

The quantum efficiency and absorption rate were measured using a quantum yield measurement device when the fluorescent substance of Comparative Example 10 was excited with light having a wavelength of 340 nm. The results showed that the quantum efficiency was 3%, the absorption rate was 40%, and the light emission intensity was 27. The fluorescent substance synthesized in Comparative Example 10 had a light emission peak at 766 nm. In the case of using the fused alumina as the raw material, the light emission could be confirmed, but its light emission intensity was low. The fused alumina contains a small amount of β-alumina, but its amount is very small, about 1%.

Comparative Example 11

In Comparative Example 11, a fluorescent substance was synthesized using fused alumina as a raw material. The fused alumina was a product manufactured by Kojundo Chemical Laboratory Co., Ltd. The raw material used when synthesizing the fluorescent substance was composed of 2.17 g of $Na_2CO_3$, 2.32 g of fused alumina, 41 mg of $FeCl_2 \cdot 4H_2O$, and 470 mg of beam ($BaCl_2$). These raw materials were mixed in a mortar, placed in an alumina crucible, and calcined at 1450° C. for 2 hours in an atmospheric atmosphere.

The quantum efficiency and absorption rate were measured using a quantum yield measurement device when the fluorescent substance of Comparative Example 11 was excited with light having a wavelength of 340 nm. The results showed that the quantum efficiency was 20%, the absorption rate was 35%, and the light emission intensity was 135. The fluorescent substance synthesized in Comparative Example 11 had a light emission peak at 772 nm. It was confirmed that even when using the fused alumina, the light emission amount could be made large by increasing the amount of Na.

Comparative Example 12

In Comparative Example 12, a fluorescent substance was synthesized using β-alumina as a raw material to produce $Na-nAl_2O_3$:Fe as a target. β-alumina with a shape of powder with ca. 3 μm was obtained from Kojundo Chemical Laboratory Co., Ltd., and used.

The raw material used when synthesizing the fluorescent substance was composed of 1.08 g of $NaCO_3$, 1.15 g of β-alumina (mixed-phase product), 9 mg of $FeCl_2 \cdot 4H_2O$, and 260 mg of beam ($BaCl_2$). These materials were mixed in a mortar, placed in an alumina crucible, and calcined at a calcining temperature of 1450° C. for 2 hours in an atmospheric atmosphere.

The quantum efficiency and absorption rate were measured using a quantum yield measurement device when the fluorescent substance of Example 6 was excited with light having a wavelength of 340 nm. The results showed that the quantum efficiency was 2%, the absorption rate was 17%, and the light emission intensity was 18. The fluorescent substance synthesized in Example 6 had a light emission peak at 779 nm. The grain diameter of the fluorescent substance was measured by a grain diameter distribution measurement device, and its grain diameter (D50) was 5.9 μm.

Example 1

In Example 1 of a near-infrared light-emitting fluorescent substance, a fluorescent substance was synthesized using 3-alumina as raw material. β-alumina contains Na as a raw material for alumina and is a mixed-phase product (sintered product) composed of $NaAl_{11}O_{17}$ (β phase) and $NaAl_5O_8$ (β" phase). Here, the β phase and β" phase are collectively referred to as β-alumina (or $β-Al_2O_3$). Herein, the term "β-alumina" as used refers to a substance containing 50% or more of a β-alumina component and having β-alumina as a main component. β-alumina with a shape of powder with ca. 3 μm was obtained from Kojundo Chemical Laboratory Co., Ltd., and used. This β-alumina contained 90% or more of β-alumina, although X-ray analysis showed heterogeneous phases thought to be α-alumina and γ-alumina. The β-alumina contained 6.5% by weight of Na.

The raw material used when synthesizing the fluorescent substance was composed of 0.38 g of $BaCO_3$, 1.48 g of β-alumina (mixed-phase product), 30 mg of $FeCl_2 \cdot 4H_2O$, and 110 mg of beam ($BaCl_2$). These materials were mixed in a mortar, placed in an alumina crucible, and calcined at a calcining temperature of 1450° C. for 2 hours in an atmospheric atmosphere.

The quantum efficiency and absorption rate were measured using a quantum yield measurement device when the near-infrared light-emitting fluorescent substance of Example 1 was excited with light having a wavelength of 340 nm. The results showed that the quantum efficiency was 69%, the absorption rate was 46%, and the light emission intensity was 556. The fluorescent substance synthesized in Example 1 had a light emission peak at 771 nm. The grain diameter of the fluorescent substance was measured by the grain diameter distribution measurement device, and its grain diameter (D50) was 5.3 μm. The fluorescent substance of Example 1 had substantially the same amount of the raw material as that of Comparative Example 5, but had a higher light emission intensity, compared to when the calcined alumina was used (light emission intensity of 361).

Example 2

In Example 2, a fluorescent substance was synthesized using β-alumina as a raw material. β-alumina with a shape of powder with ca. 3 μm was obtained from Kojundo Chemical Laboratory Co., Ltd., and used.

The raw material used when synthesizing the fluorescent substance was composed of 0.38 g of $BaCO_3$, 1.48 g of β-alumina (mixed-phase product), 47 mg of $FeCl_2 \cdot 4H_2O$, and 110 mg of beam ($BaCl_2$). These materials were mixed in a mortar, placed in an alumina crucible, and calcined at a calcining temperature of 1450° C. for 2 hours in an atmospheric atmosphere.

The quantum efficiency and absorption rate were measured using the quantum yield measurement device when the fluorescent substance of Example 2 was excited with light having a wavelength of 340 nm. The results showed that the quantum efficiency was 52%, the absorption rate was 55%, and the light emission intensity was 511. The fluorescent substance synthesized in Example 2 had a light emission peak at 777 nm. The grain diameter of the fluorescent substance was measured by the grain diameter distribution measurement device, and its grain diameter (D50) was 3.7 μm.

Example 3

In Example 3, a fluorescent substance was synthesized using β-alumina as a raw material. β-alumina with a shape of powder with ca. 3 μm was obtained from Kojundo Chemical Laboratory Co., Ltd., and used.

The raw material used when synthesizing the fluorescent substance was composed of 0.43 g of $BaCO_3$, 1.45 g of β-alumina (mixed-phase product), 47 mg of $FeCl_2 \cdot 4H_2O$, and 55 mg of beam ($BaCl_2$). These materials were mixed in a mortar, placed in an alumina crucible, and calcined at a calcining temperature of 1450° C. for 2 hours in an atmospheric atmosphere.

The quantum efficiency and absorption rate were measured using the quantum yield measurement device when the fluorescent substance of Example 3 was excited with light having a wavelength of 340 nm. The results showed that the quantum efficiency was 52%, the absorption rate was 54%, and the light emission intensity was 494. The fluorescent substance synthesized in Example 3 had a light emission peak at 775 nm. The grain diameter of the fluorescent substance was measured by the grain diameter distribution measurement device, and its grain diameter (D50) was 2.6 µm.

Example 4

In Example 4, a fluorescent substance was synthesized using β-alumina as a raw material. β-alumina with a shape of powder with ca. 3 µm was obtained from Kojundo Chemical Laboratory Co., Ltd., and used.

The raw material used when synthesizing the fluorescent substance was composed of 0.43 g of $BaCO_3$, 1.49 g of β-alumina (mixed-phase product), 8 mg of $FeCl_2 \cdot 4H_2O$, and 55 mg of beam ($BaCl_2$). These materials were mixed in a mortar, placed in an alumina crucible, and calcined at a calcining temperature of 1450° C. for 2 hours in an atmospheric atmosphere.

The quantum efficiency and absorption rate were measured using the quantum yield measurement device when the fluorescent substance of Example 4 was excited with light having a wavelength of 340 nm. The results showed that the quantum efficiency was 90%, the absorption rate was 31%, and the light emission intensity was 503. The fluorescent substance synthesized in Example 4 had a light emission peak at 771 nm. The grain diameter of the fluorescent substance was measured by the grain diameter distribution measurement device, and its grain diameter (D50) was 2.4 µm.

Example 5

In Example 5, a fluorescent substance was synthesized using β-alumina as a raw material. β-alumina with a shape of powder with ca. 3 µm was obtained from Kojundo Chemical Laboratory Co., Ltd., and used.

The raw material used when synthesizing the fluorescent substance was composed of 0.43 g of $BaCO_3$, 1.48 g of β-alumina (mixed-phase product), 24 mg of $FeCl_2 \cdot 4H_2O$, and 55 mg of beam ($BaCl_2$). These materials were mixed in a mortar, placed in an alumina crucible, and calcined at a calcining temperature of 1450° C. for 2 hours in an atmospheric atmosphere.

The quantum efficiency and absorption rate were measured using the quantum yield measurement device when the fluorescent substance of Example 5 was excited with light having a wavelength of 340 nm. The results showed that the quantum efficiency was 79%, the absorption rate was 38%, and the light emission intensity was 533. The fluorescent substance synthesized in Example 5 had a light emission peak at 769 nm. The grain diameter of the fluorescent substance was measured by the grain diameter distribution measurement device, and its grain diameter (D50) was 3.2 µm.

Example 6

In Example 6, a fluorescent substance was synthesized using β-alumina as a raw material to produce Na-n$Al_2O_3$:Fe as a target. β-alumina with a shape of powder with ca. 3 µm was obtained from Kojundo Chemical Laboratory Co., Ltd., and used.

The raw material used when synthesizing the fluorescent substance was composed of 0.42 g of $NaCO_3$, 1.11 g of β-alumina (mixed-phase product), 8 mg of $FeCl_2 \cdot 4H_2O$, and 55 mg of beam ($BaCl_2$). These materials were mixed in a mortar, placed in an alumina crucible, and calcined at a calcining temperature of 1450° C. for 2 hours in an atmospheric atmosphere.

The quantum efficiency and absorption rate were measured using the quantum yield measurement device when the fluorescent substance of Example 6 was excited with light having a wavelength of 340 nm. The results showed that the quantum efficiency was 76%, the absorption rate was 37%, and the light emission intensity was 503. The fluorescent substance synthesized in Example 6 had a light emission peak at 770 nm. The grain diameter of the fluorescent substance was measured by the grain diameter distribution measurement device, and its grain diameter (D50) was 4.7 µm.

Example 7

In Example 7, a fluorescent substance was synthesized using β-alumina as a raw material to produce Na-n$Al_2O_3$:Fe as a target. β-alumina with a shape of powder with ca. 3 µm was obtained from Kojundo Chemical Laboratory Co., Ltd., and used.

The raw material used when synthesizing the fluorescent substance were 1.11 g of β-alumina (mixed-phase product), 8 mg of $FeCl_2 \cdot 4H_2O$, and 55 mg of beam ($BaCl_2$). These materials were mixed in a mortar, placed in an alumina crucible, and calcined at a calcining temperature of 1450° C. for 2 hours in an atmospheric atmosphere. It is noted that in Example 7, $NaCO_3$ was not contained in the raw material.

The quantum efficiency and absorption rate were measured using the quantum yield measurement device when the fluorescent substance of Example 7 was excited with light having a wavelength of 340 nm. The results showed that the quantum efficiency was 88%, the absorption rate was 26%, and the light emission intensity was 413. The fluorescent substance synthesized in Example 7 had a light emission peak at 773 nm. The grain diameter of the fluorescent substance was measured by the grain diameter distribution measurement device, and its grain diameter (D50) was 2.2 µm.

Example 8

In Example 8, a fluorescent substance was synthesized using β-alumina as a raw material to produce Na-n$Al_2O_3$:Fe as a target. β-alumina with a shape of powder with ca. 3 µm was obtained from Kojundo Chemical Laboratory Co., Ltd., and used.

The raw material used when synthesizing the fluorescent substance was composed of 0.27 g of $NaCO_3$, 1.15 g of β-alumina (mixed-phase product), 9 mg of $FeCl_2 \cdot 4H_2O$, and 260 mg of beam ($BaCl_2$). These materials were mixed in a mortar, placed in an alumina crucible, and calcined at a calcining temperature of 1450° C. for 2 hours in an atmospheric atmosphere.

The quantum efficiency and absorption rate were measured using the quantum yield measurement device when the fluorescent substance of Example 8 was excited with light having a wavelength of 340 nm. The results showed that the quantum efficiency was 90%, the absorption rate was 34%, and the light emission intensity was 530. The fluorescent substance synthesized in Example 8 had a light emission peak at 770 nm. The grain diameter of the fluorescent substance was measured by the grain diameter distribution measurement device, and its grain diameter (D50) was 3.8 μm.

Example 9

In Example 9, a fluorescent substance was synthesized using β-alumina as a raw material to produce Na-nAl$_2$O$_3$:Fe as a target. β-alumina with a shape of powder with ca. 3 μm was obtained from Kojundo Chemical Laboratory Co., Ltd., and used.

The raw material used when synthesizing the fluorescent substance was composed of 0.27 g of NaCO$_3$, 1.15 g of β-alumina (mixed-phase product), 23 mg of FeCl$_2$·4H$_2$O, and 260 mg of beam (BaCl$_2$). These materials were mixed in a mortar, placed in an alumina crucible, and calcined at a calcining temperature of 1450° C. for 2 hours in an atmospheric atmosphere.

The quantum efficiency and absorption rate were measured using the quantum yield measurement device when the fluorescent substance of Example 9 was excited with light having a wavelength of 340 nm. The results showed that the quantum efficiency was 45%, the absorption rate was 79%, and the light emission intensity was 646. The fluorescent substance synthesized in Example 9 had a light emission peak at 771 nm. The grain diameter of the fluorescent substance was measured by the grain diameter distribution measurement device, and its grain diameter (D50) was 3.7 μm.

Example 10

In Example 10, a fluorescent substance was synthesized using β-alumina as a raw material to produce Na-nAl$_2$O$_3$:Fe as a target. β-alumina with a shape of powder with ca. 3 μm was obtained from Kojundo Chemical Laboratory Co., Ltd., and used.

The raw material used when synthesizing the fluorescent substance was composed of 0.27 g of NaCO$_3$, 1.15 g of β-alumina (mixed-phase product), and 23 mg of FeCl$_2$·4H$_2$O. These materials were mixed in a mortar, placed in an alumina crucible, and calcined at a calcining temperature of 1450° C. for 2 hours in an atmospheric atmosphere. It is noted that in Example 10, beam was not contained in the raw material.

The quantum efficiency and absorption rate were measured using the quantum yield measurement device when the fluorescent substance of Example 10 was excited with light having a wavelength of 340 nm. The results showed that the quantum efficiency was 56%, the absorption rate was 43%, and the light emission intensity was 439. The fluorescent substance synthesized in Example 10 had a light emission peak at 771 nm. The grain diameter of the fluorescent substance was measured by the grain diameter distribution measurement device, and its grain diameter (D50) was 4.2 μm.

Example 11

In Example 11, a fluorescent substance was synthesized using β-alumina as a raw material to produce Na-nAl$_2$O$_3$:Fe as a target. β-alumina with a shape of powder with ca. 3 μm was obtained from Kojundo Chemical Laboratory Co., Ltd., and used.

The raw material used when synthesizing the fluorescent substance was composed of 0.27 g of NaCO$_3$, 1.15 g of β-alumina (mixed-phase product), 23 mg of FeCl$_2$·4H$_2$O, and 260 mg of beam (BaCl$_2$). These materials were mixed in a mortar, placed in an alumina crucible, and calcined at a calcining temperature of 1350° C. for 2 hours in an atmospheric atmosphere.

The quantum efficiency and absorption rate were measured using the quantum yield measurement device when the fluorescent substance of Example 11 was excited with light having a wavelength of 340 nm. The results showed that the quantum efficiency was 61%, the absorption rate was 40%, and the light emission intensity was 464. The fluorescent substance synthesized in Example 11 had a light emission peak at 771 nm. The grain diameter of the fluorescent substance was measured by the grain diameter distribution measurement device, and its grain diameter (D50) was 3.3 μm.

Example 12

In Example 12, a fluorescent substance was synthesized using β-alumina as a raw material to produce Na-nAl$_2$O$_3$:Fe as a target. β-alumina with a shape of powder with ca. 3 μm was obtained from Kojundo Chemical Laboratory Co., Ltd., and used.

The raw material used when synthesizing the fluorescent substance was composed of 0.27 g of NaCO$_3$, 1.15 g of β-alumina (mixed-phase product), 23 mg of FeCl$_2$·4H$_2$O, and 260 mg of beam (BaCl$_2$). These materials were mixed in a mortar, placed in an alumina crucible, and calcined at a calcining temperature of 1500° C. for 2 hours in an atmospheric atmosphere.

The quantum efficiency and absorption rate were measured using the quantum yield measurement device when the fluorescent substance of Example 12 was excited with light having a wavelength of 340 nm. The results showed that the quantum efficiency was 63%, the absorption rate was 59%, and the light emission intensity was 682. The fluorescent substance synthesized in Example 12 had a light emission peak at 771 nm. The grain diameter of the fluorescent substance was measured by the grain diameter distribution measurement device, and its grain diameter (D50) was 4.8 μm. As can be seen from the comparison with Example 11, the higher the calcining temperature is, the higher and better the light emission intensity becomes.

Example 13

In Example 13, a fluorescent substance was synthesized using calcined alumina as a raw material. The calcined alumina was a product manufactured by SHINKOSHA CO., LTD. and was alumina fabricated by calcination. In Example 13, unlike Comparative Examples 2 to 9, Na$_2$CO$_3$ was contained in the raw materials instead of BaCO$_3$. In addition, NaBr was used as the beam. The target fluorescent substance composition is Na-nAl$_2$O$_3$:Fe (although it can be described as Na$_2$O-n'Al$_2$O$_3$, it is described herein as Na-nAl$_2$O$_3$:Fe because Na$_2$CO$_3$ was added as a raw material). The raw material used when synthesizing the fluorescent substance was composed of 0.42 g of NaCO$_3$, 1.11 g of calcined alumina, 8 mg of FeCl$_2$·4H$_2$O, and 210 mg of beam (BaCl$_2$). These materials were mixed in a mortar, placed in an alumina crucible, and calcined at a calcining temperature of 1450° C. for 2 hours in an atmospheric atmosphere.

The quantum efficiency and absorption rate were measured using the quantum yield measurement device when the fluorescent substance of Example 13 was excited with light having a wavelength of 340 nm. The results showed that the quantum efficiency was 78%, the absorption rate was 31%, and the light emission intensity was 410. The fluorescent substance synthesized in Example 13 had a light emission peak at 770 nm.

Example 14

In Example 14, a fluorescent substance was synthesized using β-alumina as a raw material to produce $CaAl_{12}O_{19}$:Fe as a target. β-alumina with a shape of powder with ca. 3 μm was obtained from Kojundo Chemical Laboratory Co., Ltd., and used.

The raw material used when synthesizing the fluorescent substance was composed of 0.23 g of $CaCO_3$, 1.59 g of β-alumina (mixed-phase product), 8 mg of $FeCl_2·4H_2O$, and 59 mg of beam ($BaCl_2$). These materials were mixed in a mortar, placed in an alumina crucible, and calcined at a calcining temperature of 1450° C. for 2 hours in an atmospheric atmosphere.

The quantum efficiency and absorption rate were measured using the quantum yield measurement device when the fluorescent substance of Example 14 was excited with light having a wavelength of 340 nm. The results showed that the quantum efficiency was 98%, the absorption rate was 25%, and the light emission intensity was 469. The fluorescent substance synthesized in Example 14 had a light emission peak at 767 nm.

Example 15

In Example 15, a fluorescent substance was synthesized using β-alumina as a raw material to produce $SrAl_{12}O_{19}$:Fe as a target. β-alumina with a shape of powder with ca. 3 μm was obtained from Kojundo Chemical Laboratory Co., Ltd., and used.

The raw material used when synthesizing the fluorescent substance was composed of 0.34 g of $SrCO_3$, 1.59 g of β-alumina (mixed-phase product), 8 mg of $FeCl_2·4H_2O$, and 59 mg of beam ($BaCl_2$). These raw materials were mixed in a mortar, placed in an alumina crucible, and calcined at a calcining temperature of 1450° C. for 2 hours in an atmospheric atmosphere.

The quantum efficiency and absorption rate were measured using the quantum yield measurement device when the fluorescent substance of Example 15 was excited with light having a wavelength of 340 nm. The results showed that the quantum efficiency was 99%, the absorption rate was 28%, and the light emission intensity was 478. The fluorescent substance synthesized in Example 15 had a light emission peak at 771 nm.

<Results>

As can be seen from the above-described data about various near-infrared light-emitting fluorescent substances, the fluorescent substances that were made by containing 50% or more of β-alumina in the raw materials showed good results in terms of the quantum efficiency, absorption rate, and light emission intensity. By comparing Comparative Examples 10 and 11, it can be understood that even when the fluorescent substances are made using fused alumina as the raw material, the quantum efficiency, absorption rate, and light emission intensity are improved by containing a large amount of Na in the raw material. For example, in Example 13, the fluorescent substance was made using calcined alumina as the raw material, but by adding a large amount of $Na_2CO_3$, it shows high quantum efficiency, absorption rate, and light emission intensity. On the other hand, as can be seen from the experimental results of Comparative Example 12, even when a fluorescent substance is made using β-alumina as the raw material, the addition of excessive Na causes the grain diameter of the fluorescent substances to become extremely coarse, thus failing to obtain the desired quantum efficiency, absorption rate, and light emission intensity. To obtain the desired light emitting peak intensity and the quantum efficiency×absorption rate, for example, as shown in the graphs of FIG. 20, Na is desirably contained at a rate in the range indicated by the arrows of these graphs, i.e., at 6.1 to 15.9 wt. % in the whole raw material. β-alumina used in Examples 1 to 12, 14, 15 and Comparative Example 12 in this study contained Na at 6.0 to 7.0 wt. %. As can be seen from the experimental results of Examples 11 and 12, the higher the temperature at which the raw materials for the fluorescent substance are calcined is, the better the absorption rate and luminescence intensity is made. The temperature at which the raw materials for the fluorescent substance are calcined is, for example, 1300° C. or higher, and preferably 1500° C. or higher. The average grain diameter (value of the grain diameter of the particles of 50% by volume) of the fluorescent substances made in each of Examples 1 to 12 was 5.3 μm or less. It is noted that although $AlF_3$ or NaBr can be used as the beam, since the degree of sintering of the fluorescent substance is rather large in the use of $AlF_3$ or NaBr, the use of $BaCl_2$ is preferred because it can be used instead to control the grain diameter of the fluorescent substance to be smaller. As an activator, for example, at least one of Fe, Cr, Bi, Tl, Ce, Tb, Eu, and Mn, or a combination thereof may be added.

<Excitation and Light Emission Spectra of Near-Infrared Light-Emitting Fluorescent Substance>

Subsequently, an excitation spectrum and a light emission spectrum of the present disclosure will be described.

FIG. 5 shows an excitation spectrum of a near-infrared light-emitting fluorescent substance ($BaAl_{12}O_{19}$:Fe) of the present disclosure. The excitation band of $BaAl_{12}O_{19}$:Fe is in the range of 300 to 400 nm, and especially, the peak of the excitation band is 340 nm. Thus, $BaAl_{12}O_{19}$:Fe is suitable for excitation with an LED that emits light having a wavelength of 340 nm.

FIG. 6 shows a light emission spectrum of the fluorescent substance ($BaAl_{12}O_{19}$:Fe) when it is excited with near ultraviolet light having a wavelength of 340 nm. The fluorescent substance ($BaAl_{12}O_{19}$:Fe) of the present disclosure has a light emitting peak wavelength of about 774 nm, a full width at half maximum of 86 nm, and a sufficiently large light emission intensity at a wavelength of 800 nm. That is, the fluorescent substance ($BaAl_{12}O_{19}$:Fe) of the present disclosure has a light emitting component on the longer wavelength side than 750 nm. In addition, its half value width is wider than 50 nm.

In contrast, the known fluorescent substance ($LiAlO_2$:Fe) has a light emitting peak wavelength of 750 nm or less. In addition, $Al_2O_3$:Cr has a sharp light emission spectrum with a narrow full width at half maximum. As mentioned above, in a biochemical analyzing device, the analysis is performed using light with 12 types of specific wavelengths between 340 nm and 800 nm. To this end, it is necessary to use a fluorescent substance that has a sufficiently wide full width at half maximum covering these wavelengths and has a sufficient light emission intensity of the near infrared light having a wavelength of 800 nm. The known fluorescent substances have difficulty in meeting the above-described requirements.

FIG. 7 shows an excitation spectrum of a near-infrared light-emitting fluorescent substance (Na-nAl$_2$O$_3$:Cr (β-alumina)) of the present disclosure. While the peak wavelength of the excitation spectrum of Cr-activated fluorescent substance having a Ga-based matrix composition is around 460 nm, the peak wavelength of the excitation spectrum of the near-infrared light-emitting fluorescent substance (Na-nAl$_2$O$_3$:Cr (β-alumina)) of the present disclosure is around 420 nm. Therefore, the near-infrared light-emitting fluorescent substance (Na-nAl$_2$O$_3$:Cr (β-alumina)) of the present disclosure is suitable for excitation with an LED chip that emits light having a wavelength of 405 nm. The above-described characteristics are excitation band characteristics based on the combination of light emission centers of β-alumina and Cr.

When fabricating a light source using an LED element that combines an LED chip for emitting light having a wavelength of 405 nm and an LED chip for emitting light having a wavelength of 340 nm, the light emission intensity of the light with a wavelength of 405 nm is large, and thus a Cr-activated Al-based fluorescent substance or an Al,Ga-based fluorescent substance, which has a wider full width at half maximum of the light emission spectrum than Na-nAl$_2$O$_3$:Cr (β-alumina), is considered to be used as the near-infrared light-emitting fluorescent substance. An example of such a fluorescent substance may include Y$_3$(Al,Ga)$_5$O$_{12}$:Cr.

In addition to Fe and Cr, it is also effective to add Bi, Tl, Ce, Tb, Eu, or Mn to the raw materials as additive elements. These elements can be added alone or they can be added to the raw materials in combination of a plurality of types, such as Ce and Fe, or Eu and Cr. These elements not only serve as light emission centers, but also form trap levels in the fluorescent substance, contributing to the light emission.

[Material for Fluorescent Substance Used in Light Source]

In order to emit light having a wavelength of 340 to 800 nm from the light source, it is effective to use, in addition to the near-infrared light-emitting fluorescent substance, a near-ultraviolet light-emitting fluorescent substance, a blue light-emitting fluorescent substance, a green light-emitting fluorescent substance, a red light-emitting fluorescent substance, and the like.

As the near-ultraviolet light-emitting fluorescent substance, for example, Y$_2$SiO$_5$:Ce (P47) fluorescent substance can be used. As the blue light-emitting fluorescent substance, for example, BaMgAl$_{10}$O$_{17}$:Eu (BAM) fluorescent substance (340 nm excitation), or (Sr,Ca,Ba)$_{10}$(PO$_4$)$_6$Cl$_2$:Eu (SCA) fluorescent substance (405 nm excitation) can be used. As the green light-emitting fluorescent substance, for example, (Sr,Ba,Mg)$_2$SiO$_4$:Eu (BOS) fluorescent substance can be used. As the red light-emitting fluorescent substance, for example, CaAlSiN$_3$:Eu (CASN) fluorescent substance can be used.

Examples of the fluorescent substances that emit blue light when excited with near ultraviolet light can include Sr$_5$(PO$_4$)$_3$Cl:Eu, Ba$_5$SiO$_4$Cl$_6$:Eu, (Sr, Ba) Al$_2$Si$_2$O$_8$:Eu, BaMg$_2$Al$_{16}$O$_{27}$:Eu, Sr$_4$Al$_{14}$O$_{25}$:Eu, Sr$_2$P$_2$O$_7$:Eu, Sr$_3$(PO$_4$)$_2$:Eu, LiSrPO$_4$:Eu, Ba$_3$MgSi$_2$O$_8$:Eu, BaAl$_2$S$_4$:Eu, CaF$_2$:Eu, BaSi$_2$O$_2$N$_2$:Eu, YBO$_3$:Ce, Sr$_3$(BO$_3$)$_2$:Ce, LaAl(Si,Al)$_6$(N,O)$_{10}$:Ce, Y$_2$O$_3$:Bi, GaN:Zn, ZnS:Ag,Cl, and ZnS:Ag,Br.

Examples of the fluorescent substances that emit green light when excited with near ultraviolet light can include Sr$_2$SiO$_4$:Eu, Ba$_2$SiO$_4$:Eu, SrAl$_2$O$_4$:Eu, CaAl$_2$S$_4$:Eu, SrAl$_2$S$_4$:Eu, CaGa$_2$S$_4$:Eu, SrGa$_2$S$_4$:Eu, β-SiAlON:Eu, CaSi$_2$O$_2$N$_2$:Eu, SrSi$_2$O$_2$N$_2$:Eu, Ba$_3$Si$_6$O$_{12}$N$_2$:Eu, BaMgAl$_{10}$O$_{17}$:Eu,Mn, Zn$_2$GeO$_4$:Mn, ZnS:Cu,Al, ZnO:Zn, LiTbW$_2$O$_8$, NaTbW$_2$O$_8$, and KTbW$_2$O$_8$.

Examples of the fluorescent substances that emit yellow and orange light when excited with near ultraviolet light can include Ca$_3$SiO$_5$:Eu, Sr$_3$SiO$_5$:Eu, Ba$_3$SiO$_5$:Eu, Li$_2$SrSiO$_4$:Eu, Sr$_2$Ga$_2$SiO$_7$:Eu, Sr$_3$(BO$_3$)$_2$:Eu, α-SiAlON:Eu, Sr$_3$SiO$_5$:Ce, and ZnS:Mn.

Examples of the fluorescent substances that emit red light when excited with near ultraviolet light can include LiEuW$_2$O$_8$, NaEuW$_2$O$_8$, KEuW$_2$O$_8$, Li$_5$EuW$_4$O$_{16}$, Na$_5$EuW$_4$O$_{16}$, K$_5$EuW$_4$O$_{16}$, Ca$_2$ZnSi$_2$O$_7$:Eu, SrS:Eu, Sr$_2$Si$_5$N$_8$:Eu, Ba$_2$Si$_5$N$_8$:Eu, Sr$_2$P$_2$O$_7$:Eu,Mn, Ba$_3$MgSi$_2$O$_8$:Eu,Mn, CuAlS$_2$:Mn, and Ba$_2$ZnS$_3$:Mn.

Examples of the fluorescent substances that emit near infrared light when excited with near ultraviolet to blue light can include Y$_3$Al$_5$O$_{12}$:Cr, BaMgAl$_{10}$O$_{17}$:Cr, Lu$_3$Ga$_5$O$_{12}$:Cr, Lu$_3$Al$_5$O$_{12}$:Cr, Y$_3$Ga$_5$O$_{12}$:Cr, Ga$_2$O$_3$Cr, Y$_3$(Al,Ga)$_5$O$_{12}$:Cr, (Al,Ga)$_2$O$_3$:Cr, Gd$_3$Ga$_5$O$_{12}$:Cr, Gd$_3$(Al,Ga)$_5$O$_{12}$:Cr, SrSnO$_3$:Bi, Gd$_3$Sc$_2$Al$_3$O$_{12}$:Cr, Zn$_3$Ga$_2$Ge$_2$O$_{10}$:Cr, La$_3$GaGe$_5$O$_{16}$:Cr, ZnGa$_2$O$_4$:Cr, and Zn(Al,Ga)$_2$O$_4$:Cr.

Examples of the near-infrared light-emitting fluorescent substance can include Y$_3$Al$_5$O$_{12}$:Fe, Y$_3$Al$_5$O$_{12}$:Ce,Fe, BaMgAl$_{10}$O$_{17}$:Fe, BaMgAl$_{10}$O$_{17}$:Eu,Fe, ZnAl$_2$O$_4$:Fe, LiAl$_5$O$_8$:Fe, GdAlO$_3$:Fe, BeAl$_2$O$_4$:Fe, MgAl$_2$O$_4$:Fe, GdMgAl$_{11}$O$_{19}$:Fe, LaAlO$_3$:Fe, YAl$_3$(BO$_3$)$_4$:Fe, GdAl$_3$(BO$_3$)$_4$:Fe, (Al,Ga)$_2$O$_3$:Fe, (Al,Ga)$_2$O$_3$:Eu,Fe, and the like. In addition, these near-infrared light-emitting fluorescent substances can be synthesized using the β-alumina described in the present disclosure as the raw material. Furthermore, these near-infrared light-emitting fluorescent substances can be synthesized by mixing at least one of the elements Pr, Sm, Yb, Er, Nd, Dy, and Tm.

The average grain diameter of the fluorescent substance used in the light source of the present disclosure is desirably 5 μm or less. Here, the average grain diameter of the fluorescent substance can be defined as follows. Methods of examining an average grain diameter of particles (fluorescent substance particles) include a method of measuring by a grain diameter distribution measurement device, a method of direct observation with an electron microscope, and the like.

Here, when taking the case of examination with the electron microscope as an example, the average grain diameter of the fluorescent substance can be calculated as follows. Respective sections of variables of the grain diameter of the particles ( . . . , 0.8 to 1.2 μm, 1.3 to 1.7 μm, 1.8 to 2.2 μm, . . . , 6.8 to 7.2 μm, 7.3 to 7.7 μm, 7.8 to 8.2 μm, . . . , etc.) are represented by class values ( . . . , 1.0 μm, 1.5 μm, 2.0 μm, . . . , 7.0 μm, 7.5 μm, 8.0 μm, . . . ), respectively. This class value is defined as $x_i$. Then, if the frequency of each variable observed with the electron microscope is denoted by $f_i$, the average value A is represented as follows.

$$A = \Sigma x_i f_i / \Sigma f_i = \Sigma x_i f_i / N \text{ where } \Sigma f_i = N.$$

As described above, the near-infrared light-emitting fluorescent substance of the present disclosure is suitable for use as a wavelength conversion material in combination with an LED element that emits near ultraviolet light because of its excitation band wavelength corresponding to near ultraviolet light. Therefore, this near-infrared light-emitting fluorescent substance exhibits excellent effects when used as a light source for biochemical analysis. Further, since the average grain diameter of this fluorescent substance is small, it is suitable for being mixed in resin and causing the light emitted by the LED element and passing through the fluorescent substances to serve as the excitation light.

Although β-alumina with a shape of powder with ca. 3 μm was obtained from Kojundo Chemical Laboratory Co., Ltd. And used in the above-described experimental examples, β-alumina having a grain diameter of about 0.1 to 3 μm may be used as a starting raw material.

<Fabrication of Light Source Used in Biochemical Analyzing Device>

Configuration Examples 1 to 5 of various light sources to which the fluorescent substance of the present disclosure was applied will be described below.

Configuration Example 1

A light source was fabricated by placing a transparent resin with the fluorescent substance mixed therein, onto an LED element for emitting near ultraviolet light. The light source of Configuration Example 1 used an LED chip for emitting light having a wavelength of 340 nm as the LED element, and also used fluororesin as the transparent resin. The top of an LED module was covered with quartz glass, and only one LED chip was incorporated inside the LED module.

As the fluorescent substances, the near-infrared light-emitting fluorescent substance ($Na-nAl_2O_3$:Fe) synthesized using β-alumina, the near-ultraviolet light-emitting fluorescent substance ($Y_2SiO_5$:Ce (P47)), the blue light-emitting fluorescent substance ($BaMgAl_{10}O_{17}$:Eu (BAM)), the green light-emitting fluorescent substance ($(Sr,Ba,Mg)_2SiO_4$:Eu (BOS)), and the red light-emitting fluorescent substance ($CaAlSiN_3$:Eu (CASN)) were used.

The light source was made in the following way. First, 8 mg of the near-infrared light-emitting fluorescent substance ($Na-nAl_2O_3$:Fe) and 8 mg of the near-ultraviolet light-emitting fluorescent substance ($Y_2SiO_5$:Ce) were weighed and mixed in 160 μl of fluororesin. After mixing, the mixture was left for about a day, and the fluororesin in which the near-infrared light-emitting fluorescent substance and the ultraviolet light-emitting fluorescent substance were mixed was potted on the quartz glass of the LED module. The fluororesin was dried naturally for about 30 minutes, and then baked at 50° C. for 30 minutes to solidify the surface of the fluororesin.

Next, 8 mg of each of the blue light-emitting fluorescent substance ($BaMgAl_{10}O_{17}$:Eu (BAM)), the green light-emitting fluorescent substance ($(Sr,Ba,Mg)_2SiO_4$:Eu (BOS)), and the red light-emitting fluorescent substance ($CaAlSiN_3$:Eu (CASN)) was weighed, and they were mixed in 240 μl of fluororesin. The resin in which the blue light-emitting fluorescent substance, the green light-emitting fluorescent substance, and the red light-emitting fluorescent substance were mixed was left for about a day and then potted onto the resin layer containing the near-infrared light-emitting fluorescent substance that had already been formed. Consequently, a two-layered structure was produced to be composed of a layer in which the near-infrared light-emitting fluorescent substance and the near-ultraviolet light-emitting fluorescent substance were mixed, and a layer in which the blue light-emitting fluorescent substance, the green light-emitting fluorescent substance, and the red light-emitting fluorescent substance were mixed.

The fluororesin was dried naturally for about 30 minutes, and then baked at 50° C. for 30 minutes to solidify the surface of the fluororesin. Thereafter, the fluororesin was solidified by being dried naturally for several days, thus fabricating the light source.

FIG. 8 shows a light emission spectrum of the light source of Configuration Example 1. As illustrated in FIG. 8, it was confirmed that the near-infrared light emission had a peak of light emission intensity at around 800 nm. As described above, the light source of Configuration Example 1 was formed by combining the LED element and the fluorescent substance having a wide light emission wavelength band. The above-described light source can suppress uneven luminance because of a single LED chip, and emits light in a wide range of wavelengths near the near infrared light. When the above-described light source is applied to an analyzing device, the service life of the light source is longer, unlike when a tungsten lamp is used as the light source, thus making it possible to reduce the maintenance cost of the device. In the light source of Configuration Example 1, since the fluorescent substance of the near-infrared light emission is contained in the resin layer located closer to the LED element, the excitation with the near-ultraviolet light occurs more often, and thus near-infrared light emission occurs with high light emission intensity.

Configuration Example 2

A light source was fabricated by placing a transparent resin with the fluorescent substance mixed therein, onto an LED element for emitting near ultraviolet light. The light source of Configuration Example 2 used an LED chip for emitting light having a wavelength of 340 nm and an LED chip for emitting light having a wavelength of 405 nm as the LED element, and also used fluororesin as the transparent resin. The top of an LED module was covered with quartz glass, and each of the LED chip (wavelength of 340 nm) and the LED chip (wavelength of 405 nm) was incorporated inside the LED module.

As the fluorescent substances, the near-infrared light-emitting fluorescent substance ($Y_3(Al,Ga)_5O_{12}$:Cr) synthesized using β-alumina, the blue light-emitting fluorescent substance ($(Sr,Ca,Ba)_{10}(PO_4)_6Cl_2$:Eu (SCA)), the green light-emitting fluorescent substance ($(Sr,Ba,Mg)_2SiO_4$:Eu (BOS)), and the red light-emitting fluorescent substance ($CaAlSiN_3$:Eu (CASN)) were used.

The light source was made in the following way. First, 8 mg of the near-infrared light-emitting fluorescent substance ($Y_3(Al,Ga)_5O_{12}$:Cr) was weighed and mixed in 80 μl of fluororesin. After mixing, the mixture was left for about a day, and the fluororesin in which the near-infrared light-emitting fluorescent substance was mixed was potted on the quartz glass of the LED module. The fluororesin was dried naturally for about 30 minutes, and then baked at 50° C. for 30 minutes to solidify the surface of the fluororesin.

Next, 8 mg of each of the blue light-emitting fluorescent substance ($(Sr,Ca,Ba)_{10}(PO_4)_6Cl_2$:Eu (SCA)), the green light-emitting fluorescent substance ($(Sr,Ba,Mg)_2SiO_4$:Eu (BOS)), and red light-emitting fluorescent substance ($CaAlSiN_3$:Eu (CASN)) was weighed, and they were mixed in 240 μl of fluororesin.

$SiO_2$ microparticles (or even $Al_2O_3$ microparticles) were mixed in the above-described fluororesin as a light diffusing material. The resin in which the blue light-emitting fluorescent substance, the green light-emitting fluorescent substance, and the red light-emitting fluorescent substance were mixed was left for about a day and then potted onto the resin layer containing the near-infrared light-emitting fluorescent substance that had already been formed. Consequently, a two-layered structure was produced to be composed of a layer with the near-infrared light-emitting fluorescent substance mixed therein and a layer in which the blue light-emitting fluorescent substance, the green light-emitting fluorescent substance, and the red light-emitting fluorescent substance were mixed.

The fluororesin was dried naturally for about 30 minutes after potting, and then baked at 50° C. for 30 minutes to solidify the surface of the fluororesin. Furthermore, the fabricated light source was baked at 80° C. for 30 minutes to solidify the fluororesin. The light emission of the fabricated light source 1 was good as the light source for biochemical analysis because the light-emitting LED chip that emits light having a wavelength of 405 nm was added to the light source 1, thereby improving its light power.

Configuration Example 3

A light source was fabricated by placing a transparent resin with the fluorescent substance mixed therein, onto an LED element for emitting near ultraviolet light. The light source of Configuration Example 3 used an LED element for emitting light having a wavelength of 340 nm as the LED element, and also used fluororesin as the transparent resin. The top of an LED module was covered with quartz glass, and three LED chips were incorporated inside the LED module.

As the fluorescent substances, the near-infrared light-emitting fluorescent substance ($BaAl_{12}O_{19}$:Fe) synthesized using β-alumina, the near-ultraviolet light-emitting fluorescent substance ($Y_2SiO_5$:Ce (P47)), the blue light-emitting fluorescent substance ($BaMgAl_{10}O_{17}$:Eu (BAM)), the green light-emitting fluorescent substance ($(Sr,Ba,Mg)_2SiO_4$:Eu (BOS)), and the red light-emitting fluorescent substance ($CaAlSiN_3$:Eu (CASN)) were used.

The light source was made in the following way. First, 8 mg of the near-infrared light-emitting fluorescent substance ($BaAl_{12}O_{49}$:Fe) and 8 mg of the near-ultraviolet light-emitting fluorescent substance ($Y_2SiO_5$:Ce) were weighed and mixed in 160 µl of fluororesin. After mixing, the mixture was left for about a day, and the fluororesin in which the near-infrared light-emitting fluorescent substance and the ultraviolet light-emitting fluorescent substance were mixed was potted on the quartz glass of the LED module. The fluororesin was dried naturally for about 30 minutes, and then baked at 50° C. for 30 minutes to solidify the surface of the fluororesin.

Next, 8 mg of each of the blue light-emitting fluorescent substance ($BaMgAl_{10}O_{17}$:Eu (BAM)), the green light-emitting fluorescent substance ($(Sr,Ba,Mg)_2SiO_4$:Eu (BOS)), and the red light-emitting fluorescent substance ($CaAlSiN_3$:Eu (CASN)) was weighed, and they were mixed in 240 µl of fluororesin. The resin in which the blue light-emitting fluorescent substance, the green light-emitting fluorescent substance, and the red light-emitting fluorescent substance were mixed was left for about a day and then potted onto the resin layer containing the near-infrared light-emitting fluorescent substance that had already been formed. Consequently, a two-layered structure was produced to be composed of a layer in which the near-infrared light-emitting fluorescent substance and the near-ultraviolet light-emitting fluorescent substance were mixed, and a layer in which the blue light-emitting fluorescent substance, the green light-emitting fluorescent substance, and the red light-emitting fluorescent substance were mixed.

The fluororesin was dried naturally for about 30 minutes, and then baked at 50° C. for 30 minutes to solidify the surface of the fluororesin. Further, the fluororesin was baked at 80° C. for 30 minutes, and then baked at 150° C. for 60 minutes to thereby solidify the fluororesin. The light source fabricated in this way was good as the light source for biochemical analysis.

Configuration Example 4

A light source was fabricated by placing a transparent resin with the fluorescent substance mixed therein, onto an LED element for emitting near ultraviolet light. The light source of Configuration Example 4 used an LED chip for emitting light having a wavelength of 340 nm and an LED chip for emitting light having a wavelength of 405 nm as the LED element, and also used fluororesin as the transparent resin. The top of an LED module was covered with quartz glass, and three LED chips (wavelength of 340 nm) and one LED chip (wavelength of 405 nm) were incorporated inside the LED module.

As the fluorescent substances, the near-infrared light-emitting fluorescent substance ($Y_3(Al,Ga)_5O_{12}$:Cr) synthesized using β-alumina, the blue light-emitting fluorescent substance ($(Sr,Ca,Ba)_{10}(PO_4)_6Cl_2$:Eu (SCA)), the green light-emitting fluorescent substance ($(Sr,Ba,Mg)_2SiO_4$:Eu (BOS)), and the red light-emitting fluorescent substance ($CaAlSiN_3$:Eu (CASN)) were used.

The light source was made in the following way. First, 8 mg of the near-infrared light-emitting fluorescent substance ($Y_3(Al,Ga)_5O_{12}$:Cr) was weighed and mixed in 80 µl of fluororesin. After mixing, the mixture was left for about a day, and the fluororesin in which the near-infrared light-emitting fluorescent substance was mixed was potted on the quartz glass of the LED module. The fluororesin was dried naturally for about 30 minutes, and then baked at 50° C. for 30 minutes to solidify the surface of the fluororesin.

Next, 8 mg of each of the blue light-emitting fluorescent substance ($(Sr,Ca,Ba)_{10}(PO_4)_6Cl_2$:Eu (SCA)), the green light-emitting fluorescent substance ($(Sr,Ba,Mg)_2SiO_4$:Eu (BOS)), and the red light-emitting fluorescent substance ($CaAlSiN_3$:Eu (CASN)) was weighed, and they were mixed in 240 µl of fluororesin.

$SiO_2$ microparticles (or even $Al_2O_3$ microparticles) were mixed in the above-described fluororesin as a light diffusing material. The resin in which the blue light-emitting fluorescent substance, the green light-emitting fluorescent substance, and the red light-emitting fluorescent substance were mixed was left for about a day and then potted onto the resin layer containing the near-infrared light-emitting fluorescent substance that had already been formed. Consequently, a two-layered structure was produced to be composed of a layer with the near-infrared light-emitting fluorescent substance mixed therein and a layer in which the blue light-emitting fluorescent substance, the green light-emitting fluorescent substance, and the red light-emitting fluorescent substance were mixed.

The fluororesin was dried naturally for about 30 minutes after potting, and then baked at 50° C. for 30 minutes to solidify the surface of the fluororesin. Further, the fabricated light source was baked at 80° C. for 30 minutes, and then baked at 200° C. for 60 minutes to thereby solidify the fluororesin. The light emission of the fabricated light source 1 was good as the light source for biochemical analysis because the light-emitting LED chip that emits light having a wavelength of 405 nm was added to the light source 1, thereby improving its light power.

Configuration Example 5

A light source was fabricated by placing a transparent resin with the fluorescent substance mixed therein, onto an LED element for emitting near ultraviolet light. The light source of Configuration Example 5 used an LED chip for emitting light having a wavelength of 340 nm and an LED chip for emitting light having a wavelength of 405 nm as the LED element, and also used fluororesin as the transparent resin. The top of an LED module was covered with quartz glass, and each of the LED chip (wavelength of 340 nm) and the LED chip (wavelength of 405 nm) was incorporated inside the LED module.

As the fluorescent substances, the near-infrared light-emitting fluorescent substance ($BaAl_{12}O_{19}$:Fe) synthesized using β-alumina, the blue light-emitting fluorescent substance (($Sr,Ca,Ba)_{10}(PO_4)_6Cl_2$:Eu (SCA)), the green light-emitting fluorescent substance (($Sr,Ba,Mg)_2SiO_4$:Eu (BOS)), and the red light-emitting fluorescent substance ($CaAlSiN_3$:Eu (CASN)) were used.

The light source was made in the following way. First, 8 mg of the near-infrared light-emitting fluorescent substance ($BaAl_{12}O_{19}$:Fe) was weighed and mixed in 80 μl of fluororesin. After mixing, the mixture was left for about a day, and the fluororesin in which the near-infrared light-emitting fluorescent substance was mixed was potted on the quartz glass of the LED module. The fluororesin was dried naturally for about 30 minutes, and then baked at 50° C. for 30 minutes to solidify the surface of the fluororesin.

Next, 8 mg of each of the blue light-emitting fluorescent substance (($Sr,Ca,Ba)_{10}(PO_4)_6Cl_2$:Eu (SCA)), the green light-emitting fluorescent substance (($Sr,Ba,Mg)_2SiO_4$:Eu (BOS)), and the red light-emitting fluorescent substance ($CaAlSiN_3$:Eu (CASN)) was weighed, and they were mixed in 240 μl of fluororesin.

$SiO_2$ microparticles (or even $Al_2O_3$ microparticles) were mixed in the above-described fluororesin as a light diffusing material. The resin in which the blue light-emitting fluorescent substance, the green light-emitting fluorescent substance, and the red light-emitting fluorescent substance were mixed was left for about a day and then potted onto the resin layer containing the near-infrared light-emitting fluorescent substance that had already been formed. Consequently, a two-layered structure was produced to be composed of a layer with the near-infrared light-emitting fluorescent substance mixed therein and a layer in which the blue light-emitting fluorescent substance, the green light-emitting fluorescent substance, and the red light-emitting fluorescent substance were mixed.

The fluororesin was dried naturally for about 30 minutes after potting, and then baked at 50° C. for 30 minutes to solidify the surface of the fluororesin. Further, the fabricated light source was baked at 80° C. for 30 minutes, and then baked at 200° C. for 60 minutes to thereby solidify the fluororesin. The light emission of the fabricated light source 1 was good as the light source for biochemical analysis because the light-emitting LED chip that emits light having a wavelength of 405 nm was added to the light source 1, thereby improving its light power.

In Examples 1 to 15, various examples of the near-infrared light-emitting fluorescent substances and various configuration examples of the light sources using these near-infrared light-emitting fluorescent substances have been described above. Next, Examples associated with the configurations of the broadband light source devices utilizing these will be described sequentially.

Example 16

Example 16 is an example associated with one configuration of the broadband light source device. This example will be described using FIGS. 9A and 9B and 10A-10D. FIGS. 9A and 9B show a schematic view of the broadband light source device 11 of the present example, in which FIG. 9A is a side sectional view thereof, and FIG. 9B is a top sectional view thereof.

The broadband light source device 11 includes an LED substrate 12, a light pipe 15, a housing 16, a cooling mechanism 17, a fan 18, and a photodetector 19. The LED substrate 12 is provided with the LED chip 13 and the LED chip 14 and has the function of emitting light beams of a plurality of wavelength bands.

The LED chip 13 is a surface light source that emits a light beam having a wavelength of 340 nm as the center of a wavelength band through Lambertian radiation, and it may be referred to herein as a second LED chip. The LED chip 14, referred to herein as the first LED chip, includes fluorescent substances, on a surface light source which emits light beams having wavelength band centers ranging from 370 to 390 nm. The fluorescent substance in the LED chip 14 has the function of absorbing light having a wavelength of 385 nm and converting it into light beams of Lambartian radiation in the wavelength band ranging 400 nm to 800 nm. As described above, the fluorescent substance includes, for example, alumina and at least one of Fe, Cr, Bi, Tl, Ce, Tb, Eu, and Mn, and can be produced by calcining a raw material, which contains sodium at 6.1 to 15.9 wt. % in the whole raw material.

The light pipe 15 is a quadrangular prism body made of a transparent material. The transparent material desirably has low absorption of light beam having the wavelengths from 340 nm to 800 nm, and synthetic quartz or transparent plastic can be applied to the transparent material. A transparent plastic having a high transmittance for a light beam having a wavelength of 340 nm is preferably selected as the transparent plastic. For example, it can be manufactured at low cost by molding with a cyclo olefin polymer resin, such as ZEONOR (registered trademark) 1060R (Zeon Corporation) or ZEONEX (registered trademark) 340.

When resin molding is applied, light leakage occurs from a protrusion at a gate. To avoid this, it is preferable to create a gate or resin inflow path structure on an incident surface or an exit surface, and then to perform dicing after molding. After dicing, the surface may be polished to a mirror surface. The rough surface obtained after dicing may be used as the exit surface. In this case, since the rough surface has a scattering function, the effect of shortening the total length of the light pipe can be obtained. The incident surfaces of the light pipe 15 for the light beam, i.e., the surface in contact with the LED substrate 12 and its side surfaces, are desirably mirror surfaces.

Although the light beams emitted from the LED substrate 12 are Lambertian radiation, the positions of the LED chip 13 and the LED chip 14 are physically eccentric, so that the axis of the light emitted from each chip is shifted in an optical system using a lens. The light pipe 15 is provided to compensate for such a shift. The light beams incident on the light pipe 15 are confined by its side surfaces due to a difference in refractive index and are made uniform through their repeated total reflection. The length of the light pipe 15 is set within the range of 10 to 20 times of the size of the incident surface, thereby achieving sufficient uniformity of the light beams therethrough. If the length of the light pipe is intended to be shortened, this shortening can be achieved by imparting a diffusing function to the exit surface of the light pipe 15 (opposite to the incident surface) and using the internal reflection and the diffusion function.

The broadband light source device 11 uniformly color-mixes the light beams having wavelength of 340 nm to 800 nm and emitted from the LED substrate 12 in the light pipe 15 and thereby can achieve a uniform broadband light source with high efficiency. The housing 16 is a mechanism that supports the LED substrate 12 and the light pipe 16. The housing 16 may be formed of plastic or metal. Desirably, if the housing 16 is formed of a metal with high thermal conductivity, for example, aluminum, the housing 16 can be used as a path to dissipate heat from the LED substrate 12, thereby suppressing the deterioration of the LED substrate 12 and improving its service life. The cooling mechanism 17 has the function of cooling the LED substrate 12. Specifically, a Peltier is provided on the surface of the cooling mechanism in contact with the LED substrate 12, and a mechanism with fins serving as a path to release heat is disposed on the back surface of the Peltier. The fins are desirably made of a material with high thermal conductivity, and can be realized of aluminum, for example.

The broadband light source device 11 includes a thermistor (not shown) to measure the temperature of the LED substrate 12, and also has the function of controlling the Peltier of the cooling mechanism 17 so as to keep the light source device at a constant temperature.

The thermistor is preferably provided near the LED chip 14 on the LED substrate 12. Since the LED chip 14 has a wider wavelength band range than that of the LED chip 13, the power input in the LED chip 14 becomes larger than that of the LED chip 13. By monitoring the temperature near the LED chip 14, it is possible to cool the LED substrate 12 in a stable manner. The fan 18 is provided so as to effectively dissipate heat accumulating in the fins of the cooling mechanism 17 through airflow, and a general fan can be used.

Figure 13A:
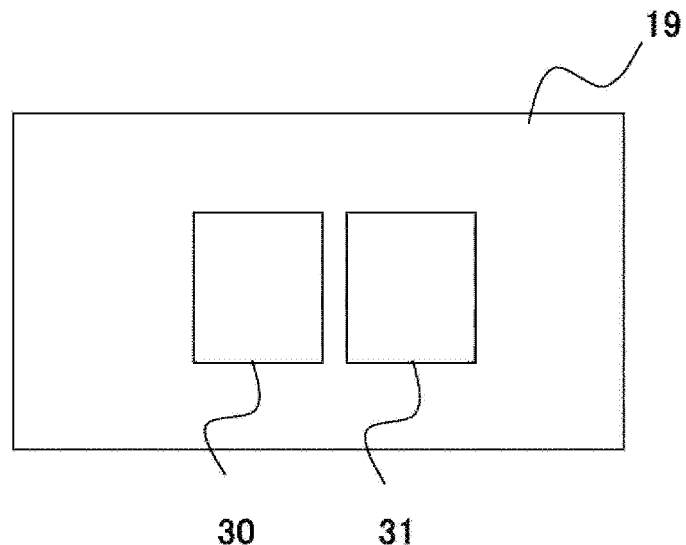
FIGS. 13A and 13B are schematic views illustrating a photodetector according to the example.

The photodetector 19 of the broadband light source device of the present example will be described using FIGS. 13A and 13B. The photodetector 19 is provided so as to detect the light beams emitted from the LED substrate 12, and is used to detect the output from the LED chip 13 and the LED chip 14 and to control the amount of light beam of each chip to a certain level. The photodetector 19 includes sensors 30 and 31 as illustrated in FIG. 13A, or sensors 30 to 32 as illustrated in FIG. 13B of the same figure.

The sensor 30 is a sensor that detects the amount of the light beam from the LED chip 13 and has the function of detecting only the light having a wavelength of 340 nm. For example, the sensor 30 is a general silicon-based sensor and can be realized by providing a notch filter that transmits only the light having the wavelength of 340 nm, immediately in front of the sensor. The sensor 31 is a sensor that detects the amount of the light beam from the LED chip 14 and has the function of detecting the light beams in which the center of the wavelength band ranges from 370 to 390 nm. For example, the sensor 31 is also a general silicon-based sensor and can be realized by providing a notch filter that transmits only the light having the wavelengths ranging from 370 to 390 nm, immediately in front of the sensor.

Figure 13B:
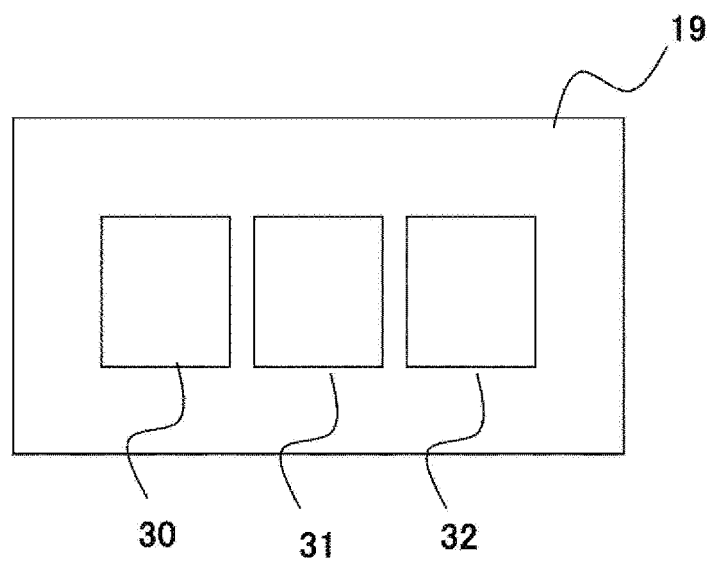

The sensor 32 illustrated in FIG. 13B is a sensor that detects the amount of light beam from the LED chip 14 and has the function of detecting the light beams whose wavelength bands have the centers ranging from 400 to 800 nm. For example, the sensor 31 is a general silicon-based sensor and can be realized by providing a filter that blocks only the light having the wavelength of 400 nm or less, immediately in front of the sensor.

The sensors 30 and 31 provide results that are highly correlated with the currents input to the LED chips 13 and 14, i.e., the first and second LED chips, respectively. Thus, the broadband light source device 11 can control the current values based on the monitored values by the sensor 30 and the sensor 31, and can accurately control the light beams of the LED chip 13 and the LED chip 14.

When the fluorescent substance of the LED chip 14 deteriorates, the amount of light beams emitted from the fluorescent substance at 400 nm to 800 nm differs from the amount of light beams at 370 nm to 390 nm for excitation of the fluorescent substance. For this reason, the broadband light source device 11 can have the function of determining the degree of deterioration of the LED chip 14 by detecting the wavelength range in which the amount of light beam emitted from the LED chip 14 differs from those in other wavelength ranges, using the sensors 31 and 32, and of alarming the time of replacement.

FIGS. 10A to 10D are diagrams for explaining the relationship between the LED chip arrangement on the LED substrate 12 and the incident surface of the light pipe 15 in the broadband light source device 11 of the present example. As illustrated in FIG. 10A, the LED chips 13 and 14 can be set larger in size relative to the incident surface of the light pipe 15. In this case, a built-in error of the light pipe 15 and LED substrate 12 can be almost ignored. The LED chip 14 having a wider wavelength range desirably has a larger area overlapping the incident surface of the light pipe 15 than in the LED chip 13. It is noted that the built-in error can be compensated by adjusting the currents in the LED chips 13 and 14 so that the desired output is obtained by a broadband photodetector to be described later.

As illustrated in FIG. 10B, the LED chip 14 may be set larger in size than the LED chip 13. The LED chip 13, which has a narrower wavelength range, has a larger margin for the amount of light beam than the LED chip 14, and therefore the LED chip 13 can be a smaller chip without any problem.

As illustrated in FIG. 10C, three LED chips, namely, the LED chip 13, an LED chip 58, and an LED chip 59 may be provided on the LED substrate 12. The LED chip 58 is a surface light source that emits a light beam having the wavelength band center of 375 nm through Lambertian radiation. The LED chip 59 includes the fluorescent substance on the surface light source that emits a light beam having the wavelength band center of 405 nm, and the fluorescent substance has the function of absorbing light having a wavelength of 405 nm and converting it into light beams of Lambartian radiation in the wavelength band ranging 400 nm to 800 nm. As described above, the fluorescent substance includes, for example, alumina and at least one of Fe, Cr, Bi, Tl, Ce, Tb, Eu, and Mn, and can be produced by calcining a raw material, which contains sodium at 6.1 to 15.9 wt. % in the whole raw material.

When the light beams from the three LED chips 13, 58, and 59 are taken into the incident surface of the light pipe 15, they are mixed together uniformly. By disposing a large number of chips in this way, it is also possible to reduce the wavelength width per chip.

As illustrated in FIG. 10D, two LED chips 13 and two LED chips 14 may be disposed onto the incident surface of the light pipe 15. Also in this case, the light beams are mixed together uniformly when taken into the light pipe 15. With this configuration, only one of the LED chip 13 and the LED chip 14 is caused to light up. For example, if one LED deteriorates and the amount of light monitored by the photodetector 19 becomes smaller than its initial value, the other LED chip can be used to extend its service life.

In order to obtain a sufficient output required for inspection of broadband light using the fluorescent substance, such as that in the LED chip 14, it is preferable that a chip with a size of 0.5 mm square or larger is used. The size of the incident surface of the light pipe 15 is preferably one mm square or more and 2 mm square or less. The reason for this is that the larger the size of the incident surface of the light pipe is, the lower the efficiency of the light source device becomes, whereas the smaller the size of the incident surface of the light pipe is, the larger a difference in the efficiency between the devices.

FIG. 11 is a schematic configuration view of an optical system of the biochemical analyzing device using the broadband light source device 11 of the present example. The biochemical analyzing device is provided with at least the broadband light source device 11, three apertures 22, two lenses 21 and 23, an inspection cell 24, a concave diffraction grating 26, and a broadband photodetector 27. The light beams having wavelengths of 340 nm to 800 nm and emitted from the broadband light source device 11 are focused by the lens 21 and illuminate the inspection cell 24. The lens 21 can focus the light beyond the inspection cell 24 to illuminate the inspection cell 24 at the desired size.

The light scattered by the inspection cell 24 is taken in the lens 23 and illuminate the concave diffraction grating 26. The concave diffraction grating 26 has a lens function and a diffractive reflection function, and is configured to shift a reflection angle of a light beam for each wavelength. The light separated for each wavelength has its amount detected by the broadband photodetector 27 for each wavelength. The broadband photodetector 27 is provided with a sensor for each wavelength and is realized by providing a bandpass filter that allows only the light with a predetermined wavelength to pass therethrough, on the entire surface of each of the plurality of sensors.

As described above, the biochemical analyzing device includes a light analyzing device constituted of the concave diffraction grating 26 and the broadband photodetector 27. The biochemical analyzing device performs control by utilizing a signal detected by the broadband photodetector 27 when the inspection cell 26 is empty, as a reference signal, and thereby has the function of correcting the amount of light beams of the broadband light source device 11 so as to obtain the desired signal. The aperture is provided to prevent generation of stray light. The number of rays propagating through the path from the concave diffraction grating 26 to the broadband photodetector 27 in the figure corresponds to the number of wavelengths to be detected. The figure shows a case where seven wavelength bands are inspected, but the light can be separated into 10 or 11 wavelength bands.

FIG. 12A shows a top cross-sectional view of a plurality of inspection cells 24 of FIG. 11 when they are disposed on a circle. It is desirable that an area through which the light of the inspection cells 24 passes is flat. In the case of such a flat surface, the problem of the optical axis shifting along with rotation due to the lens function for light that would occur in the case of a round or curved surface can be avoided. As schematically illustrated in FIG. 12A, the biochemical analyzing device has the rotation mechanism (not shown) which rotates the plurality of inspection cells 24 on the circumference, and thereby it can sequentially inspect the plurality of inspection cells 24 by rotating these cells on the circumference.

Figure 12B:
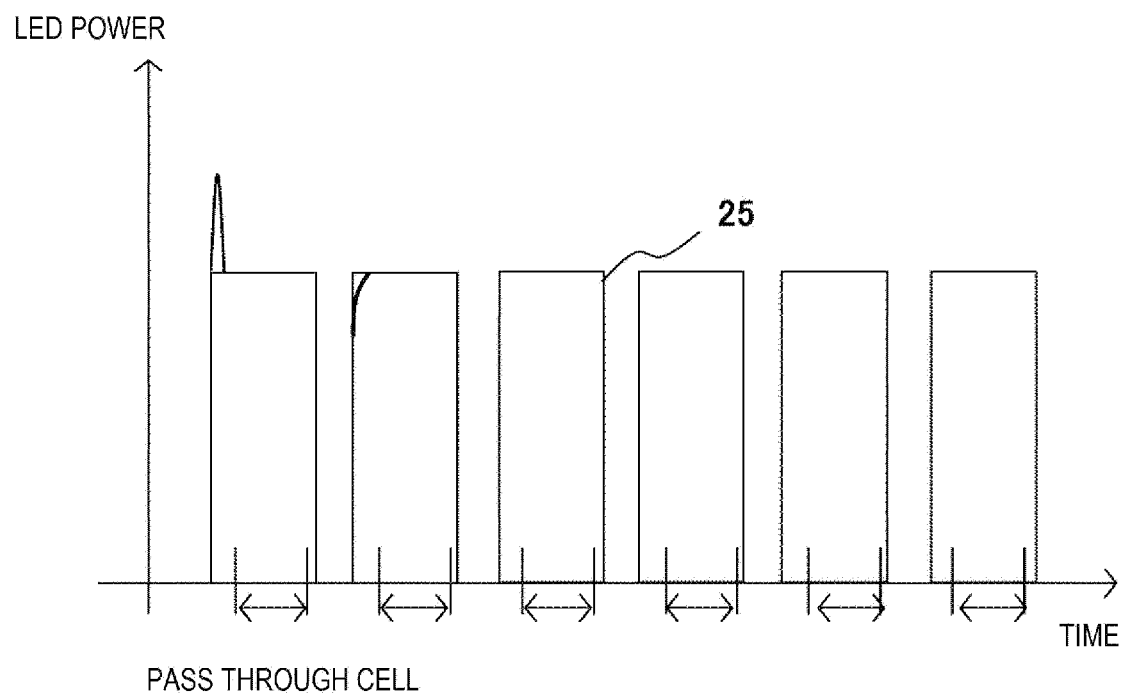

Conventional biochemical analyzing devices use a lamp light source, and the lamp light source lights up at all times. In contrast, LEDs can be driven by pulses because of fast ON/OFF time of light emission. For this reason, in the biochemical analyzing device of the present example, as illustrated in FIG. 12B, light emission is caused to occur by applying a drive pulse 25 to the broadband light source device 24 only when the light passes through the inspection cell 24. The broadband light source device 11 can be caused to emit light in synchronization with the rotation mechanism that rotates the plurality of inspection cells 24. For example, only the LED chip 13 may be caused to emit light at all times, while the broadband photodetector 27 may monitor the light having that wavelength and turn the LED chip 14 ON and OFF using the monitored light as a triggering signal.

Since the LED chip 14 including the fluorescent substance has a wider wavelength range than the LED chip 13 and utilizes a larger amount of power than the LED chip 14, providing OFF times as described above can suppress the amount of heat generated and contribute to a longer service life. As schematically illustrated in FIG. 12B, when the LED is turned ON, overshoot and dullness become problematic until the power reaches a predetermined value. Because of this, the stable operation of the LED can be achieved by causing the LED to light up slightly before the time when it passes through the inspection cell.

FIG. 12B illustrates an example of the relationship between the time (time) of the drive pulse 25 described above, the drive current (LED Power) of the broadband light source device 11, and the time (time) during which the light passes through the Cell.

FIGS. 14 and 15 show a system block diagram of the biochemical analyzing device according to the present example and its operating flow, respectively. The biochemical analyzing device includes the broadband light source device 11, the inspection cell 24, a light analyzing device 35 composed of the concave diffraction grating 26, and the broadband photodetector 27, and a controller 36 that controls the entire system. The controller 36 can be realized by execution of programs with a central processing unit (CPU) equipped with an ordinary storage unit (memory).

As shown in the operating flow of FIG. 15, the biochemical analyzing device of the present example starts monitoring the temperature of the broadband light source device 11 with a thermistor 28 (S1500) and starts Peltier control to control the Peltier 29 of the cooling mechanism 17 to a predetermined temperature (S1501). Thereafter, the LED chip 13 and the LED chip 14 are caused to start emitting light (S1502). Subsequently, power monitoring is started with a power monitor 34 inside the broadband light source device 11 (S1503) to thereby monitor the amount of light in the photodetector 19, and then the power control is started such that the monitored amount of light becomes a predetermined amount of light (S1504), thereby adjusting the power. Then, cell rotation to rotate the inspection cell 24 is started (S1505). Then, temperature check (S1506), power check (S1507), LED service life check (S1508), and detection signal check (S1509) are performed sequentially, and Peltier and the amount of light are controlled as appropriate until the results of these check are stabilized at the specified values. Detection is started after they are stabilized (S1510). In the power check (S1507), the coarse adjustment is performed by the photodetector 19, and the fine adjustment can be made more accurate by using a monitored value of the broadband photodetector 27 obtained when the light passes through an empty inspection cell.

Example 17

Figure 16A:
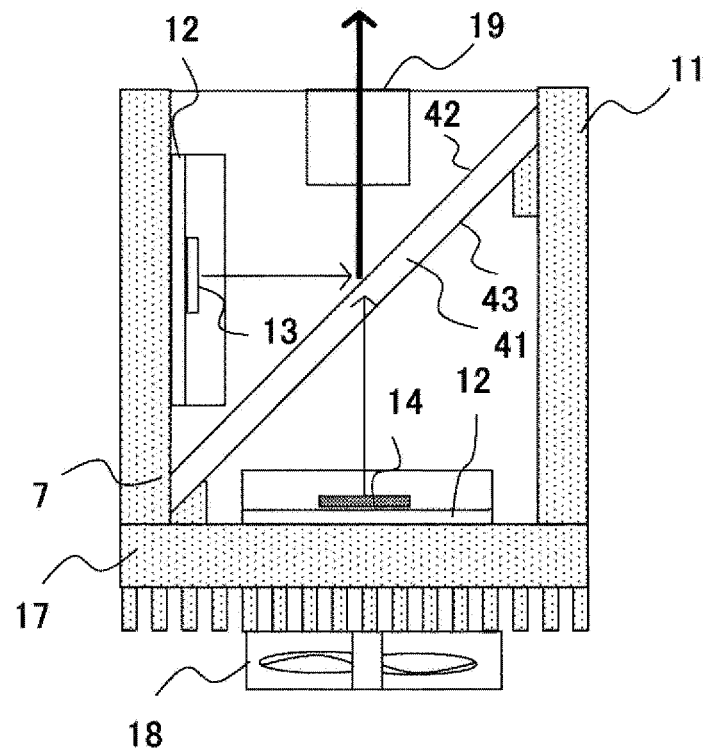
FIGS. 16A and 16B are schematic views illustrating a broadband light source device according to an example.
Figure 16B:
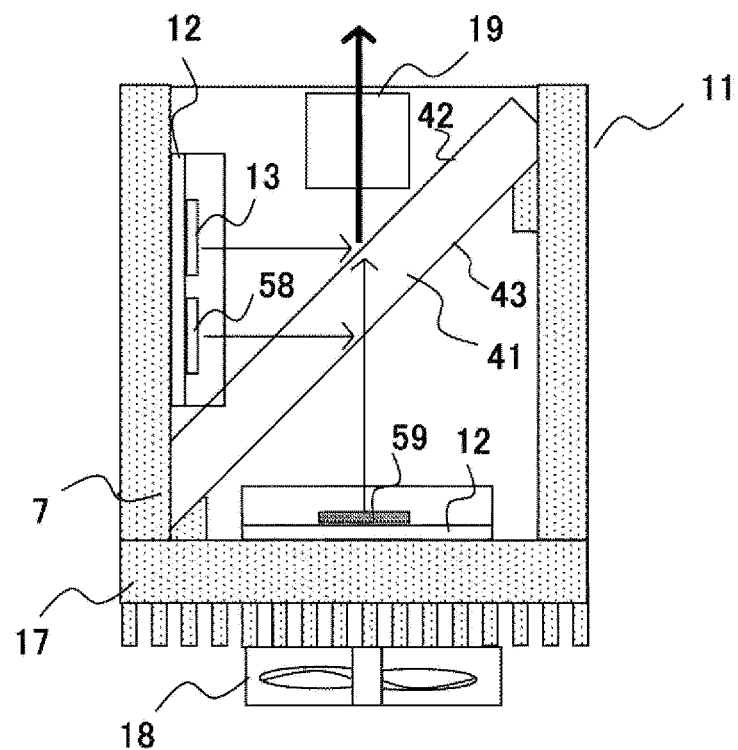

Example 17 is an example of a broadband light source device using a dichroic mirror. FIGS. 16A and 16B show side sections of the broadband light source device 11 of the present example.

First, the configuration shown in FIG. 16A will be described. The broadband light source device 11 includes two LED substrates 12, a dichroic mirror 41, a housing 7, a cooling mechanism 17, a fan 18, and a photodetector 19. The LED substrate 12 is equipped with the LED chip 13, and another LED substrate 12 is equipped with the LED chip 14.

The light emitted from the LED chip 13 is reflected by a surface 42 of the dichroic mirror 41, while the light emitted from the fluorescent substance of the LED chip 14 passes through the dichroic mirror 41, so that the optical axes of both light beams are aligned with each other. In this broadband light source device 11, the sizes of the LED chip 13 and the LED chip 14 are preferably substantially equal to each other or larger than a 1 mm square chip. This can compensate for errors in the optical axes of the light beam emitted from the LED chip 13 and the light beam emitted from the fluorescent substance of the LED chip 14 due to angular misalignment of the dichroic mirror 41 and misalignment of the positions of the LED chips 13 and 14.

If the sizes of the LED chip 13 and LED chip 14 are different or smaller than 1 mm square, the area size of the light illuminating the inspection cell 24 varies for each wavelength, and thus the sensitivity of the absorbance detected from the inspection cell changes for each wavelength. If there are also errors of the optical axes of the light beam emitted from the LED chip 13 and the light beam emitted from the fluorescent substance of the LED chip 14, and the sizes of the LED chips are smaller than 1 mm square, the position of the area of the light illuminating the inspection cell 24 varies for each wavelength, and thus the sensitivity of the absorbance detected from the inspection cell changes for each wavelength. By making the sizes of the LED chips substantially equal to each other or larger than 1 mm square, the sensitivities of their absorbances can be matched for each wavelength. The LED substrate 12 may preferably have the function of being adjusted along two axes orthogonal to the optical axis. By adjusting either one of the LED substrates 12, the optical axis of the LED chip can be eventually matched with that of another chip.

FIG. 16B differs from the configuration shown in FIG. 16A in that each of the LED chip 13, an LED chip 58, and an LED chip 59 is mounted on a corresponding one of the LED substrates 12. The light beam emitted from the LED chip 13 is reflected by the surface 42 of the dichromatic mirror 41. The light beam emitted from the LED chip 58 is reflected by a surface 43 of the dichromatic mirror 41. The light beam emitted from the LED chip 59 is allowed to pass through the dichromatic mirror 41. Thus, the optical axes of these light beams are aligned with one another. In this case, the coatings on the front and back sides of the dichroic mirror are utilized, thus enabling the optical axes of the light beams of the three LED chips to be combined without increasing the number of parts. In this case, the focus positions in the optical axial direction cannot coincide with one another. For this reason, the arrangement of the lens 21 should be considered so that the misalignment of the focus positions of the light illuminating the inspection cell are not problematic.

Unlike the case of using the light pipe 15, when a dichromatic mirror 41 is used, uneven emission on the LED chip surface to be applied may become a problem. In this case, it is preferable to dispose a diffusion sheet on the emission surface of the LED chip. The dichroic mirror has the function of allowing the light having a specific wavelength to pass therethrough and reflecting the light having another specific wavelength. A configuration that reflects light having shorter wavelengths is cheaper to realize. This is because inexpensive optical glass, such as BK7, which is degraded by the light having a wavelength of 340 nm, can be used.

Example 18

Example 18 is an example of a broadband light source device using a flat dichroic prism. That is, the broadband light source device of the present example is provided which has the configuration including: an LED substrate that is provided with a first LED chip generating a light beam having a first wavelength band and including a fluorescent substance in the light beam having the first wavelength band, and a second LED chip generating a light beam having a second wavelength band; and a flat dichroic prism disposed on the LED substrate and which allows the light beam from the fluorescent substance to pass therethrough and reflects the light beam from the second LED chip twice so as to substantially align optical axes of the two light beams.

Figure 17A:
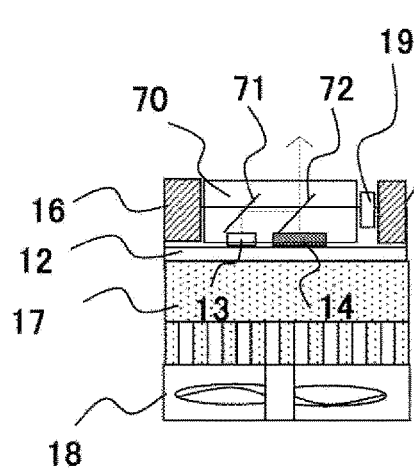
FIGS. 17A-17C are schematic views illustrating a broadband light source device according to an example.
Figure 17B:
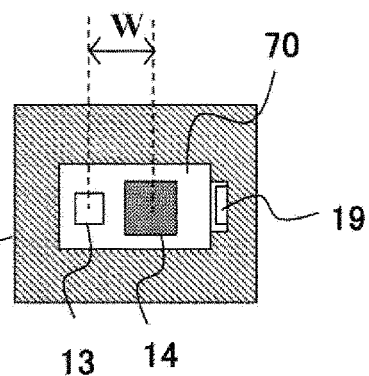
Figure 17C:
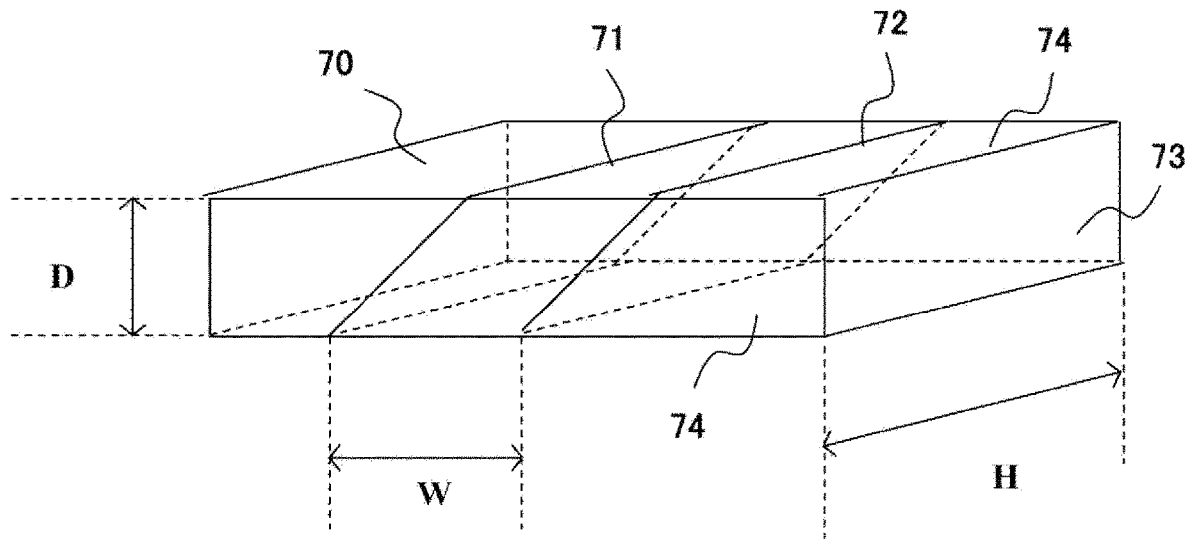

FIGS. 17A to 17C show a schematic configuration of the broadband light source device 11 of the present example. FIG. 17A shows a side cross-sectional view, FIG. 17B shows a top cross-sectional view, and FIG. 17C shows a perspective view of a configuration example of a flat dichroic prism. The broadband light source device 11 in the present example includes the LED substrate 12, a flat dichroic prism 70, the housing 16, the cooling mechanism 17, the fan 18, and the photodetector 19.

The flat dichroic prism 70 is disposed on the LED substrate 12 provided with a plurality of LED chips 13 and 14. The housing 16 has the function of fixing the flat dichroic prism 70 onto the LED substrate 12. The cooling mechanism 17 has the function of dissipating heat from and cooling the LED substrate 12. The fan 18 is provided to improve the performance of the cooling mechanism 17. On the LED substrate 12, the LED chips 13 and 14 are provided to be separated from each other by a predetermined distance W. The light emitted from the LED chip 13 is reflected twice by the surfaces 71 and 72 of the flat dichroic prism 70, and the light emitted from the fluorescent substance of the LED chip 14 passes through the surface 71 of the flat dichroic prism 70, thereby enabling the optical axes of the light beams from the two LED chips to be aligned with each other.

As shown in FIG. 17C, the surfaces 71 and 72 of the flat dichroic prism 70 are provided to be separated from each other by the distance W. By making the distance between the surface 71 and the surface 72 substantially the same as the distance W between the LED chip 13 and the LED chip 14, the optical axes of the two light beams can be perfectly aligned with each other in the ideal state.

The surfaces 71 and 72 of the flat dichroic prism 70 are wavelength-dependent surfaces that reflect the light beam in the wavelength band emitted from the LED chip 13 and allows the light beam at the wavelength emitted from the LED chip 14. Although the flat dichroic prism 70 is illustrated to reflect the light beam emitted from the LED chip 13, it may be conversely configured to reflect the light beam emitted from the LED chip 14 so that the optical axes of the two light beams are aligned with each other.

Part of the light beams emitted from the LED chips 13 and 14 is preferably allowed to travel in the direction orthogonal to the direction of the arrow in the figure on the surface 72, where the photodetector 19 is provided. Since the surface 73 of the flat dichroic prism 70 is the path in which the light travels to the photodetector 19, the light can be efficiently transmitted to the photodetector 19 by polishing the surface 73 to a smooth surface. Obviously, even the rough surface of the cut prism may also be used as long as the required amount of light can be secured, and in this case, the flat dichroic prism can be manufactured at a low cost because there is no polishing process.

For the flat dichroic prism 70, it is desirable to use a material having high transmittance in the ultraviolet region, such as synthetic quartz. Obviously, an inexpensive material such as BK7 can also be used. In this case, the surfaces 71 and 72 of the flat dichroic prism 70 can be configured to allow light in the ultraviolet wavelength band to pass therethrough and reflect light in other wavelength bands, thereby reducing absorption of the light in the ultraviolet wavelength band into the material and achieving both performance and cost.

A distance D of the flat dichroic prism 70 is desirably substantially the same as or 1.5 or less times to a value of a larger side length between a size of the light beam from the LED chip 13 and a size of the light beam from the LED chip 14. When the distance D is extremely long, for example, the light beam emitted from the fluorescent substance of the LED chip 14 passes through not only the surface 72, but also the surface 71, leading to a loss in terms of the efficiency. A distance H of the flat dichroic prism 70 is desirably substantially the same as or greater than a value of a larger side length of both sides of the LED chip 14. If the distance H is set to be substantially the same as the value of the larger side length, internal reflection is utilized by polishing the surface 74 to a mirror surface, so that the light that would otherwise leak to the side surfaces of the dichroic prism can be recycled, thus improving the efficiency.

The light beams emitted from the LED chips 13 and 14 and combined together so as to align their optical axes with each other in the flat dichroic prism 70 illuminate the inspection cell through the lens 21 as described with reference to FIG. 11. When using the flat dichroic prism 70 shown in FIGS. 17A-17C, the focal positions of the light beams emitted from the LED chips 13 and 14 and which are focused by the lens 21 are different. Therefore, when using the flat dichroic prism 70, it is preferable that the focal distance of the lens 21 is set to five times or more the distance W, which is a difference in the optical path length between the light beams from the LED chip 13 and the LED chip 14, thus reducing the difference between the focal positions near the inspection cell.

The use of the flat dichroic prism 70 makes it possible to achieve both miniaturization and efficiency equivalent to that when using the dichroic mirror. This configuration needs only one cooling mechanism 17 or fan 18, which has advantages in terms of cost in consideration of ease of assembly. In the figure, the flat dichroic prism 70 is illustrated as an example of a rectangular prism, but it may be a parallelepiped parallel to the surfaces 71 and 72. In this case, there is no need for a process of cutting the surface 73, which has an advantage in terms of cost.

FIG. 18 is a modified example of the example of the broadband light source device 11 shown in FIGS. 17A-17C when using the flat dichroic prism 70. The configuration shown in FIG. 18 differs from the configuration shown in FIGS. 17A-17C in that two LED substrates 12 are provided. The advantages of providing the LED substrate 12 for each of the LED chips 13 and 14 as shown in FIG. 18 are easiness of heat dissipation and commercial availability of LEDs. However, in the configuration shown in FIG. 18, since the distance W becomes longer, it is necessary to consider the difference in the focal position described above.

FIG. 19 is a schematic view of an optical system up to the inspection cell 24 when using the flat dichroic prism 70. In the figure, the light beam emitted from the LED chip 13 is reflected twice by the flat dichroic prism 70 and then imaged at the focusing point 113 by the lens 23A. The light beam emitted from the LED chip 14 is allowed to pass through the flat dichroic prism 70 and then imaged at the light focusing point 114 by the lens 23A. Since the two LED chips 13 and 14 are at different distances from the lens 23A, the positions where the light is focused, i.e., the focusing point 113 and 114, are different.

The inspection cell 24 is disposed on the lens 23A side with respect to the two focusing points. Since the inspection cell 24 has a diameter of about 3 mm, it is necessary to spread the entire width of the light beam to the same width as that of the inspection cell in order for the light beam to widely illuminate the inspection cell 24. Therefore, the light beam can widely illuminate the inspection cell 24 by disposing the inspection cell 24 in an area where the light beam is spread, i.e., on the lens 23A side with respect to the focusing points.

When the distance between the centers of the LED chip 13 and the LED chip 14 is the distance W and the refractive index of the flat dichroic prism 70 is N, there occurs a distance W/N, which is a difference in the distance between the light beam emitted from the LED chip 13 and the light beam emitted from the LED chip 14 due to the light beam from the LED chip 13 being reflected twice by the flat dichroic prism 70. In FIG. 19, the optical system is regarded as a virtually linear arrangement, and the LED chip 13 is also illustrated in the position at the distance W/N.

As shown in the same figure, an interval between the LED chip 14 and the lens 23A is L1, the distance between the lens 23A and the focusing point 114 is L2, an interval between the lens 23A and the center of the inspection cell 24 is L3, and a difference between the focusing points 113 and 114 is Δ.

Since the inspection cell 24 is disposed on the lens 23A side with respect to the two focusing points, it is necessary to satisfy at least a relationship expressed by the following equation in order to secure the width of the light beam.

$$L3 < L2 - \Delta \quad \text{(Equation 1)}$$

Equation 1 is a relational equation in which the interval between the lens 23A and the focusing point 113 is longer than the interval L3 between the lens 23A and the center of the inspection cell 24.

Here, L2 satisfies a relationship expressed by the following equation because of the lens formula.

$$1/L2 = 1/f - 1/L1 \quad \text{(Equation 2)}$$

When L2/L1 is set as the optical magnification M, Δ can be derived from the following equation based on the relational equation of the longitudinal magnification.

$$\Delta = M^2 \cdot W/N \quad \text{(Equation 3)}$$

When L2 and Δ, which are difficult to observe, are deleted from Equations 1 to 3, Equation 1 can be expressed as Equation 4.

[Mathematical 1]

$$L3 < \frac{L1(L1-f) - f(W/N)}{(L1-f)^2} f \quad \text{(Equation 4)}$$

Equation 4 is organized for W/N, thus giving the following equation.

$$W/N < k(L1 - k \cdot L3) \quad \text{(Equation 5)}$$

where k = L1/f − 1

Since W/N is positive, it is necessary to set k to a positive number, i.e. (L1>f). This setting is also a condition for image formation with the lens 23A as shown in FIG. 19.

It is also necessary to set L1−k/L3 to a positive number. In this case, L1 may be set larger, or L3 or k may be set smaller. As an example, for f=25 mm, L1=35 mm, and L3=60 mm, W/N is 4.4. When the refractive index is 1.5, W is preferably smaller than 6.6 mm.

For example, when the size of each of the LED chips 13 and 14 is set to 1 mm, the interval W in the flat dichroic prism 70 only needs to be 1 mm, which can easily satisfy the relational equation of mathematical 5.

The width φ1 of the light beam emitted from the LED chip 13 and illuminating the inspection cell 24 and the width φ2 of the light beam emitted from the LED chip 14 and illuminating the inspection cell 24 are different in size. For this reason, it is preferable to provide the aperture 22 and set it so that the light beams having substantially the same size with each other illuminate the inspection cell. By providing the aperture 22, it is possible to make the influence of errors, such as bubbles, on the absorbance obtained from the inspection cell the same for each wavelength.

The broadband light source device of the present invention described in detail above can be utilized as, for example, a light source for analytical instruments such as spectrophotometers and a light source for plant growth, as well as a light source for biochemical analyzing devices. In addition, the fluorescent substance according to the present invention can be utilized as a fluorescent material for biological observation and a wavelength conversion material for solar cells.

It is noted that the present invention is not limited to the above-described examples and can include various modified examples thereof.

For example, the above-mentioned examples have been described in detail for easy understanding of the present invention, and are not necessarily limited to those having all the configurations described. A part of the configuration of one example can be replaced with the configuration of another example, and the configuration of another example can also be added to the configuration of one example. Addition, deletion, and replacement of another configuration can be done with respect to a part of the configuration of each example.

Furthermore, each of the above-described configurations, functions, controllers, etc., have been described mainly by taking examples of creating programs that realizes part or all of them, but it goes without saying that part or all of them may be realized in hardware by, for example, designing them in integrated circuits. In other words, all or part of the functions of the controller may be realized by an integrated circuit such as ASIC (Application Specific Integrated Circuit), FPGA (Field Programmable Gate Array), etc., instead of programs.

REFERENCE SIGN LIST 1 light source
2 LED module
3 transparent resin
4 LED element
5 heat dissipating plate
6 wire
7 fluorescent substance
11 broadband light source device
12 LED substrate
13, 14, 58, 59 LED chip
15 light pipe
16 housing
17 cooling mechanism
18 fan
19 photodetector
21, 23, 23A lens
22 aperture
24 inspection cell
25 drive pulse
26 concave diffraction grating
27 broadband photodetector
28 temperature monitor
29 Peltier
30, 31, 32 sensor
33 mixing device
34 power monitor
35 light analyzing device
36 controller
41 dichroic mirror
42, 43, 71, 72, 73, 74 surface
70 flat dichroic prism
113, 114 light focusing point

The invention claimed is:

1. A broadband light source device, comprising:
a first LED chip that generates a light beam having a first wavelength band;
a fluorescent substance that is provided in the light beam of the first LED chip; and
a second LED chip that generates a light beam having a second wavelength band, wherein
the fluorescent substance includes at least alumina and at least one of Fe, Cr, Bi, Tl, Ce, Tb, Eu, and Mn and is produced by calcining a raw material that contains sodium at 6.1 to 15.9 wt. % in the whole raw material, and the light beam from the fluorescent substance and the light beam from the second LED chip are color-mixed,
a center of the first wavelength band is 370 to 390 nm, and a center of the second wavelength band is 340 nm.

2. The broadband light source device according to claim 1, further comprising:
a light pipe that color-mixes the light beam from the fluorescent substance and the light beam from the second LED chip, wherein
an emission size of emitting the light beam of the first LED chip and an emission size of emitting the light beam of the second LED chip are different from each other.

3. The broadband light source device according to claim 2, wherein
a sum of the two different emission sizes is larger than an incidence size of the light pipe.

4. The broadband light source device according to claim 2, further comprising:
a photodetector that monitors a light beam amount of the light beam from the fluorescent substance, wherein
the photodetector detects light beam amounts of both a wavelength band of 370 to 390 nm and a wavelength band of 400 to 800 nm, and determines deterioration of the first LED chip based on difference in variation of the light beam amounts of the wavelength band of 370 to 390 nm and the wavelength band of 400 to 800 nm from the fluorescent substance.

5. A biochemical analyzing device including the broadband light source device according to claim 4, comprising:
a control circuit that controls a light beam amount of the broadband light source device;
a plurality of inspection cells; and
a rotation mechanism that rotates the plurality of inspection cells, wherein the control circuit turns ON and OFF the light beam amount of the broadband light source device in synchronization with rotation of the inspection cells by the rotation mechanism.

6. The biochemical analyzing device according to claim 5, further comprising:
a light analyzing device that detects a light beam amount emitted from the broadband light source device for each predetermined wavelength, wherein
the control circuit constantly controls a light beam emitted from the broadband light source device based on the light beam amount detected by the light analyzing device.

7. The broadband light source device according to claim 1, further comprising:
a dichroic mirror that color-mixes the light beam from the fluorescent substance and the light beam from the second LED chip, wherein
an emission size of emitting the light beam of the first LED chip and an emission size of emitting the light beam of the second LED chip are substantially the same, and the light beam from the second LED chip is reflected by the dichroic mirror.

8. The broadband light source device according to claim 1, further comprising:
a flat dichroic prism that performs color-mixing by allowing the light beam from the fluorescent substance to pass therethrough and reflecting the light beam from the second LED chip twice.

9. The broadband light source device according to claim 8, wherein
a distance D in an optical axial direction of the flat dichroic prism is substantially the same as or 1.5 or less times to a value of a larger side length between a size of the light beam from the fluorescent substance and a size of the light beam from the second LED chip.

10. A broadband light source device, comprising:

an LED substrate that is provided with a first LED chip generating a light beam having a first wavelength band and including a fluorescent substance in the light beam having a first wavelength band, and a second LED chip generating a light beam having a second wavelength band; and a flat dichroic prism disposed on the LED substrate which allows the light beam from the fluorescent substance to pass therethrough and reflects the light beam from the second LED chip twice so as to substantially align optical axes of the two light beams, wherein the first LED chip emits a light beam having a wavelength band of 370 to 390 nm, the fluorescent substance at least converts the light beam having the first wavelength band to light of band of 400 to 800 nm, the second LED chip emits a light beam having a wavelength band of 340 nm, and light beams in a range of 340 nm to 800 nm from the flat dichroic prism are emitted from substantially the same optical axis, wherein the fluorescent substance includes at least alumina and at least one of Fe, Cr, Bi, Tl, Ce, Tb, Eu, and Mn, and is produced by calcining a raw material that contains sodium at 6.1 to 15.9 wt. % in the whole raw material.

\* \* \* \* \*